(12) United States Patent
Fulford et al.

(10) Patent No.: US 12,495,604 B2
(45) Date of Patent: Dec. 9, 2025

(54) HIGH PERFORMANCE 3D COMPACT TRANSISTOR ARCHITECTURE

(71) Applicant: Tokyo Electron Limited, Tokyo (JP)

(72) Inventors: H. Jim Fulford, Albany, NY (US); Mark I. Gardner, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 609 days.

(21) Appl. No.: 17/945,888

(22) Filed: Sep. 15, 2022

(65) Prior Publication Data

US 2024/0096708 A1    Mar. 21, 2024

(51) Int. Cl.
| | |
|---|---|
| H01L 21/02 | (2006.01) |
| H10D 30/01 | (2025.01) |
| H10D 30/43 | (2025.01) |
| H10D 30/67 | (2025.01) |
| H10D 62/10 | (2025.01) |
| H10D 84/01 | (2025.01) |
| H10D 84/03 | (2025.01) |
| H10D 84/85 | (2025.01) |

(52) U.S. Cl.
CPC ..... *H10D 84/038* (2025.01); *H01L 21/02532* (2013.01); *H01L 21/02603* (2013.01); *H10D 30/014* (2025.01); *H10D 30/43* (2025.01); *H10D 30/6735* (2025.01); *H10D 62/121* (2025.01); *H10D 84/0167* (2025.01); *H10D 84/017* (2025.01); *H10D 84/85* (2025.01)

(58) Field of Classification Search
CPC .... H10D 84/038; H10D 30/014; H10D 84/85; H10D 62/121; H10D 84/0167; H10D 30/6735; H10D 84/017; H10D 30/43; H01L 21/02532; H01L 21/02603
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 2014/0151639 A1* | 6/2014 | Chang | H10D 30/6757 257/27 |
| 2019/0067122 A1* | 2/2019 | Cheng | H01L 21/02603 |
| 2021/0407999 A1* | 12/2021 | Huang | H10D 62/121 |
| 2022/0302275 A1 | 9/2022 | Yu et al. | |
| 2023/0066597 A1* | 3/2023 | Xie | H10D 84/038 |

FOREIGN PATENT DOCUMENTS

KR    20210059471 A  *  5/2021  ....... H01L 21/02172

* cited by examiner

*Primary Examiner* — Ratisha Mehta
*Assistant Examiner* — Timothy Edward Duren
(74) *Attorney, Agent, or Firm* — Foley & Lardner LLP

(57) ABSTRACT

Semiconductor devices and corresponding methods of manufacturing the same are disclosed. For example, a plurality of first semiconductor channels vertically spaced from one another and a plurality of second semiconductor channels vertically spaced from one another, wherein different materials are simultaneously epitaxial-grown for the first semiconductor channels and the second semiconductor channels, can be provided. The plurality of first semiconductor channels each have a first sidewall in contact with a dielectric structure and the plurality of second semiconductor channels each have a first sidewall in contact with the dielectric structure. Gate structures can be formed around at least a top surface, a bottom surface, and a second sidewall of the first and second semiconductor channels.

15 Claims, 28 Drawing Sheets

HIGH PERFORMANCE 3D COMPACT TRANSISTOR ARCHITECTURE

FIELD OF THE DISCLOSURE

This disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors or channels thereof are stacked on top of each other. 3D integration, i.e., the vertical stacking of multiple devices, aims to overcome scaling limitations experienced in planar devices by increasing transistor density in volume rather than area. Although device stacking has been successfully demonstrated and implemented, various embodiments can include numerous operations, and may include maximizing device mobility while maintaining compact circuit architecture.

SUMMARY

The present disclosure relates to a 3D transistor structure and a method of fabricating the 3D transistor structure. The transistor structure disclosed herein may include a set of devices with different conductive types (e.g., PMOS, NMOS) in which different single crystal semiconductor materials may be used for as their respective channel layers. The use of different single crystal semiconductor materials allows for maximized device mobility. The techniques and structures described herein allow the mobility of devices to be maximized while maintaining a high density of devices using vertically stacked transistors or channels thereof, which allows for a higher 3D density and minimizes spacing between one or more vertically stacked transistors of the pair. Furthermore, in some embodiments, a replacement gate is not required, which reduces process steps.

One aspect of the present disclosure can be directed to a structure of a pair of transistor devices. The structure comprises a dielectric structure vertically extending from a substrate, a plurality of first semiconductor films extending away from the dielectric structure along a first lateral direction, with a first sidewall of each of the first semiconductor films in contact with the dielectric structure, and a plurality of second semiconductor films extending away from the dielectric structure along a second, opposite lateral direction, with a first sidewall of each of the second semiconductor films in contact with the dielectric structure, wherein a corresponding one of the first semiconductor films is laterally aligned with a corresponding one of the second semiconductor films, and wherein the first semiconductor films contain a first semiconductor material while the second semiconductor films contain a second semiconductor material. The structure disclosed herein further comprises a first gate structure disposed around a top surface, a bottom surface, and a second sidewall of each of the first semiconductor films, a second gate structure disposed around a top surface, a bottom surface, and a second sidewall of each of the second semiconductor films, and a pair of first source/drain structures disposed on opposite sides of the first gate structure along a third lateral direction perpendicular to the first and second lateral direction, and a pair of second source/drain structures disposed on opposite sides of the second gate structure along the third lateral direction.

In some embodiments, the first semiconductor material comprises silicon germanium, and the second semiconductor material comprises silicon.

In some embodiments, the first semiconductor material is configured for a first transistor with a first conductive type, and the second semiconductor material is configured for a second transistor with a second conductive type.

Another aspect of the present disclosure can be directed to a method of fabricating a structure of a pair of transistor devices. Techniques herein include methods of forming a set of transistors wherein different single crystal semiconductor materials are used for channel layers in each of the device regions, and the channels regions, source regions, or drain regions are vertically stacked. Techniques herein maximizes device mobility while enabling a memory or logic device to be formed from vertically stacked nanosheets or other layers. Different single crystal materials for channel layers in different devices can be simultaneously epitaxial-grown, which allows for maximized device mobility and reduces process steps. In some embodiments, any arrangement of devices with different conductive types can be implemented (e.g., PMOS-NMOS, PMOS-PMOS-NMOS, etc.).

In some embodiments, the method can comprise providing a plurality of first semiconductor films and a plurality of second semiconductor films alternately stacked on top of one another and a plurality of third semiconductor films and a plurality of fourth semiconductor films alternately stacked on top of one another, wherein the first semiconductor films and fourth semiconductor films contain a first semiconductor material, the second semiconductor films and third semiconductor films contain a second semiconductor material, and the first and second semiconductor films each have a first sidewall in contact with a dielectric structure and the third and fourth semiconductor films each have a first sidewall in contact with the dielectric structure. The first material and the second material can be simultaneously epitaxial-grown and form the semiconductor films in each of different device regions having different conductive types (e.g., PMOS, NMOS) by offsetting one of the device regions. The method further comprises removing the second semiconductor films, forming a first gate structure around at least a top surface, a bottom surface, and a second sidewall of each of the first semiconductor films opposite to its respective first sidewall, removing the fourth semiconductor films, and forming a second gate structure around at least a top surface, a bottom surface, and a second sidewall of each of the third semiconductor films opposite to its respective first sidewall.

In some embodiments, each of the first semiconductor films is laterally aligned with a corresponding one of the third semiconductor films, and each of the second semiconductor films is laterally aligned with a corresponding one of the fourth semiconductor films.

In some embodiments, the method comprises forming, over a first portion of a substrate, a first semiconductor layer containing the first semiconductor material, forming, over the first portion of the substrate and further over a second portion of the substrate, a second semiconductor layer containing the second semiconductor material, forming, over the first and second portions of the substrate, a third semiconductor layer containing the first semiconductor material, forming, over the first and second portions of the substrate, a fourth semiconductor layer containing the second semiconductor material, and forming, over the first and second portions of the substrate, a fifth semiconductor layer containing the first semiconductor material.

In some embodiments, the method comprises patterning the first to fifth semiconductor layers to form a first stack and a second stack disposed in the first portion and in the second portion, respectively, wherein the first stack includes the alternately stacked third semiconductor films and fourth semiconductor films, and the second stack includes the alternately stacked first semiconductor films and second semiconductor films.

In some embodiments, the second stack further includes a fifth semiconductor film disposed on a topmost one of the first semiconductor films, and the semiconductor film contains a third semiconductor material similar to the second semiconductor material.

In some embodiments, the first gate structure includes a first gate electrode and the second gate structure includes a second gate electrode, and the first gate electrode and second gate electrode have opposite conductive types.

In some embodiments, the first semiconductor material comprises silicon germanium, and the second semiconductor material comprises silicon.

In some embodiments, the first semiconductor material is configured for a first transistor with a first conductive type, and the second semiconductor material is configured for a second transistor with a second conductive type.

In some embodiments, the method comprises forming a pair of first source/drain regions in contact with opposite third and fourth sidewalls of each of the first semiconductor films, and forming a pair of second source/drain regions in contact with opposite third and fourth sidewalls of each of the third semiconductor films.

In some embodiments, the method comprises, prior to forming the pair of first source/drain regions, replacing at least end portions of the first gate structure that are interposed between neighboring ones of the first semiconductor films with a plurality of first dielectric spacers, respectively, and prior to forming the pair of second source/drain regions, replacing at least end portions of the second gate structure that are interposed between neighboring ones of the third semiconductor films with a plurality of second dielectric spacers, respectively.

Another aspect of the present disclosure can be directed to a method of fabricating a structure of a pair of transistor devices. The method can include forming, over a first portion of a substrate, a first stack comprising a plurality of first semiconductor films and a plurality of second semiconductor films alternately stacked on top of one another, concurrently with forming the first stack, forming, over a second portion of the substrate, a second stack comprising a plurality of third semiconductor films and a plurality of fourth semiconductor films alternately stacked on top of one another, wherein the first semiconductor films and fourth semiconductor films contain a first semiconductor material, and the second semiconductor films and third semiconductor films contain a second semiconductor material. The first material and the second material can be simultaneously epitaxial-grown and form the semiconductor films in each of different device regions having different conductive types (e.g., PMOS, NMOS) by offsetting one of the device regions. The method can further include forming a dielectric structure interposed between the first stack and the second stack, removing the second semiconductor films, forming a first gate structure around at least a top surface, a bottom surface, and a first sidewall of each of the first semiconductor films opposite to its respective first sidewall in contact with the dielectric structure, removing the fourth semiconductor films, and forming a second gate structure around at least a top surface, a bottom surface, and a second sidewall of each of the third semiconductor films opposite to its respective first sidewall in contact with the dielectric structure.

In some embodiments, each of the first semiconductor films is laterally aligned with a corresponding one of the third semiconductor films, and each of the second semiconductor films is laterally aligned with a corresponding one of the fourth semiconductor films.

In some embodiments, the first gate structure includes a first gate electrode and the second gate structure includes a second gate electrode, and the first gate electrode and second gate electrode have opposite conductive types.

In some embodiments, the first semiconductor material comprises silicon germanium, and the second semiconductor material comprises silicon.

In some embodiments, the first semiconductor material is configured for a first transistor with a first conductive type, and the second semiconductor material is configured for a second transistor with a second conductive type.

In some embodiments, the method comprises forming a pair of first source/drain regions in contact with opposite third and fourth sidewalls of each of the first semiconductor films, and forming a pair of second source/drain regions in contact with opposite third and fourth sidewalls of each of the third semiconductor films.

In some embodiments, the method comprises, prior to forming the pair of first source/drain regions, replacing at least end portions of the first gate structure that are interposed between neighboring ones of the first semiconductor films with a plurality of first dielectric spacers, respectively, and prior to forming the pair of second source/drain regions, replacing at least end portions of the second gate structure that are interposed between neighboring ones of the third semiconductor films with a plurality of second dielectric spacers, respectively.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
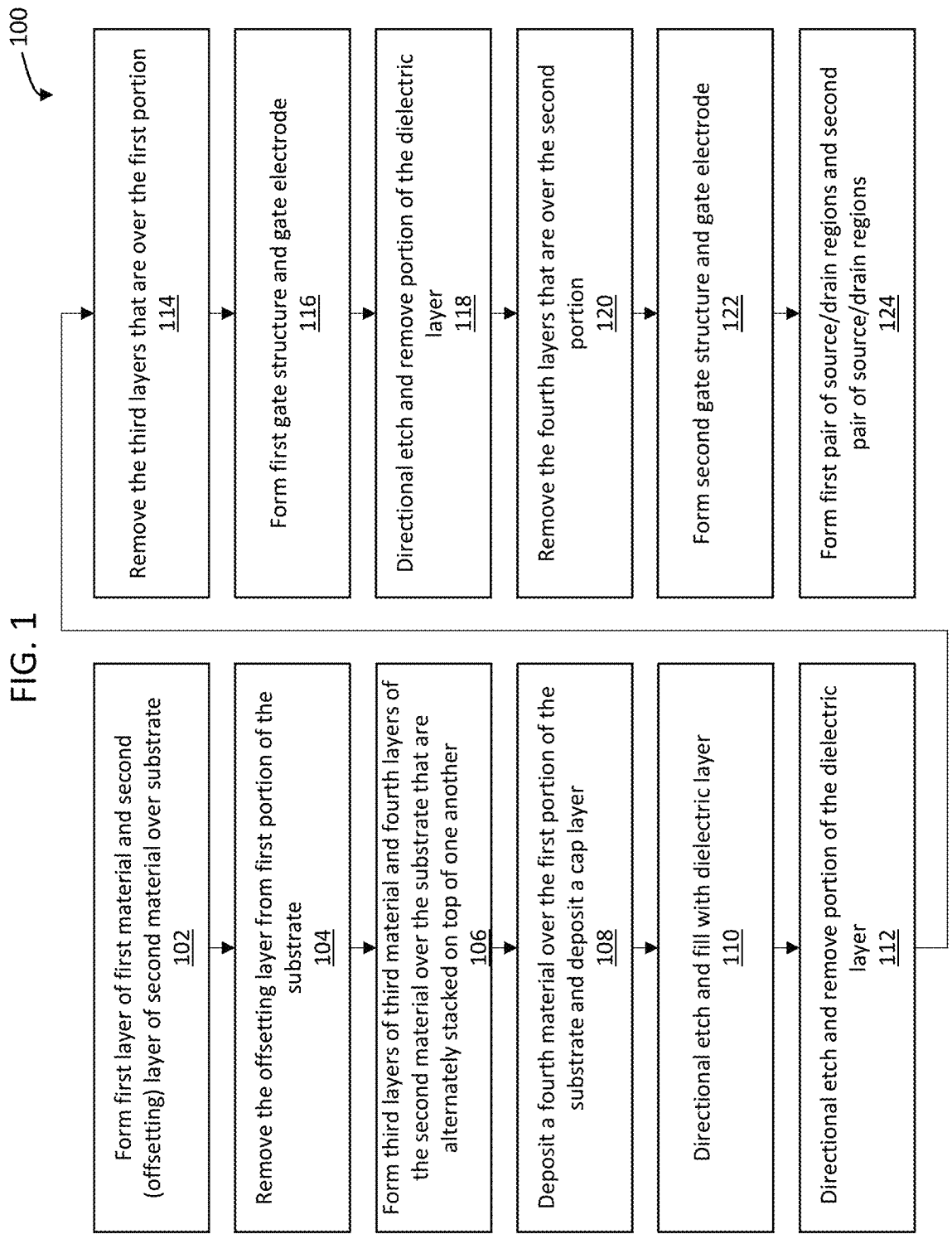
FIG. 1 is a flow chart of a method for making a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Disclosed herein are embodiments related to one or more three-dimensional transistor structures having one or more nanostructures formed from nanosheets. The nanostructures include semiconductor channels, for which different single crystal semiconductor materials such as silicon layers and silicon germanium layers can be used. For example, a pair of transistors can include both a PMOS device and a NMOS device, wherein the channel layer of the PMOS device is optimized for the PMOS operation (e.g., silicon germanium) while the channel layer of the NMOS device is optimized for the NMOS operation (e.g., silicon). Based on the use of different single crystal semiconductor materials in the channel layers of different device regions, the device mobility may be maximized while maintaining a compact circuit architecture. In some aspects, any combination of different devices with different conductive types can be laterally (e.g., side-by-side) arranged with each other.

Reference will now be made to the figures, which for the convenience of visualizing the 3D fabrication techniques described herein, illustrate a substrate undergoing a process flow. Unless expressly indicated otherwise, each figure represents one (or a set) of fabrication steps in a process flow for manufacturing the devices described herein. In the Figures, connections between conductive layers or materials may be shown. However, it should be understood that these connections between various layers and masks are merely illustrative, and are intended to show a capability for providing such connections and should not be considered limiting to the scope of the claims.

Likewise, although the figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a rectangular configuration, other shapes are also contemplated, and indeed the techniques described herein may be implemented in any shape or geometry.

FIG. 1 illustrates a flow chart of a method 100 for making a pair of NMOS and PMOS devices wherein different (e.g., single crystal) semiconductor materials are used for NMOS and PMOS channels. For example, a material for NMOS operation and another material for PMOS operation can be incorporated into the NMOS device and the PMOS device, respectively, by concurrently forming the different semiconductor materials side-by-side. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with cross-sectional or top views of an example semiconductor device (also referred to herein as a structure) at various fabrication stages as shown in FIGS. 2 to 28, which will be discussed in further detail below. It should be understood that the semiconductor device, shown in FIGS. 2 to 28, may include a number of other devices such as inductors, fuses, capacitors, coils, etc., while remaining within the scope of the present disclosure.

In brief overview, the method 100 starts with operation 102 of forming a first layer (first sacrificial layer) of a first material on a substrate and then forming an offsetting layer of a second material over the substrate. The method 100 continues to operation 104 of removing the offsetting layer from a first portion of the substrate. The method can proceed to operation 106 of forming third semiconductor layers of a third material and fourth semiconductor layers of the second material, wherein the third and the fourth semiconductor layers are alternately stacked on top of one another. The method 100 proceeds to operation 108 of forming a fifth layer (second sacrificial layer) of a fourth material over the first portion of the substrate and forming a cap layer over the substrate. The method 100 proceeds to operation 110 of directionally etching a portion of the semiconductor device while leaving first semiconductor films of the second material and second semiconductor films of the third material over the first portion of the substrate and leaving third semiconductor films of the third material and fourth semiconductor films of the second material over a second portion of the substrate, and filling the etched portion with a dielectric fill. The method 100 proceeds to operation 112 of directionally etching first openings into the semiconductor device. The method 100 proceeds to operation 114 of removing sacrificial materials, i.e., the sacrificial layer formed on the substrate, the second semiconductor films, and the fifth layer that are over the first portion of the substrate. The method 100 proceeds to operation 116 of forming a gate dielectric over the semiconductor layers and forming a metal gate electrode over the gate dielectric. The method 100 continues to operation 118 of directionally etching second openings into the semiconductor device. The method 100 proceeds to operation 120 of removing sacrificial materials, i.e., the sacrificial layer formed on the substrate, the second (offsetting) layer, and the fourth semiconductor films that are over the second portion of the substrate. The method 100 proceeds to operation 122 of forming a gate dielectric over the semiconductor layers and forming a metal gate electrode over the gate dielectric. The method 100 proceeds to operation 124 of exposing source/drain regions, and then the source/drain regions are prepared for connection such as by doping or a connection of metal electrodes.

Figure 2:
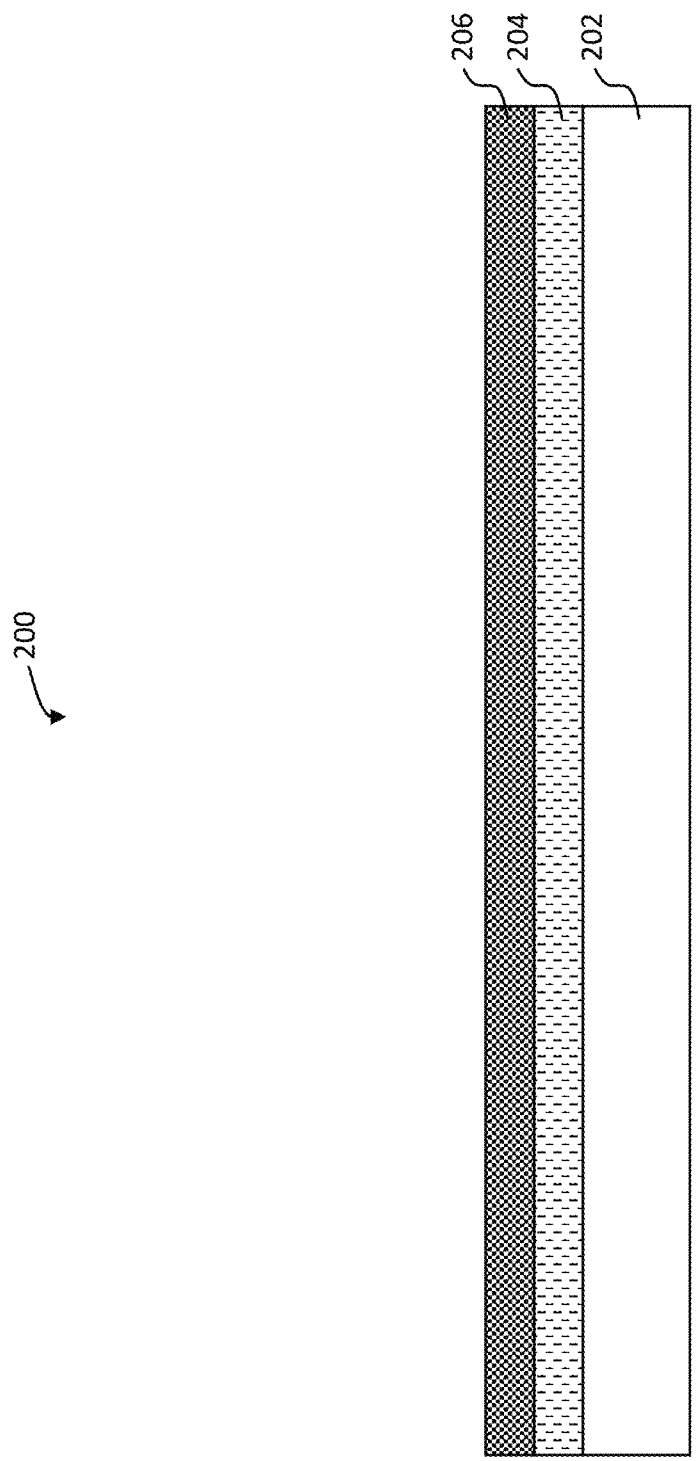
FIG. 2 illustrates a cross-sectional view of a semiconductor device during various fabrication stages, made by the method of FIG. 1, in accordance with some embodiments.

Corresponding to operation 102 of FIG. 1, FIG. 2 is a cross-sectional view of a semiconductor device 200 in which a first layer (first sacrificial layer) 204 of a first material (e.g., SiGe2) and a second (offsetting) layer 206 of a second material (e.g., SiGe) are formed over a substrate 202 (e.g., a crystalline silicon, a glass substrate, etc.), in accordance with various embodiments. In some embodiments, the first material and the second material are substantially similar (e.g., having a similar molar ratio).

As shown in FIG. 2, the first sacrificial layer 204 can be formed over the substrate 202. The first sacrificial layer 204 and the various additional dielectric and conductive layers and materials herein can be placed, grown, (e.g., epitaxially with or without a seed layer), or otherwise formed to create layers of the semiconductor device 200. The formation of the various layers of the semiconductor device 200 can include planarization of the layers, such as by cutting, ablation, chemical mechanical grinding or polishing (CMG/P), or other planarization techniques. The first sacrificial layer 204 can be or include a material which can be selectively etched, relative to one or more adjacent materials, such as the substrate 202. For example, the first sacrificial layer 204 can be formed from silicon-germanium of a first molar ratio, the substrate 202 can be formed from crystalline silicon, and the offsetting layer 206 can be formed from silicon-germanium of a second molar ratio. In some embodiments, the first material of the first sacrificial layer 204 and the second material of the offsetting layer 206 may sometimes be referred to as "SiGe2" and "SiGe," respectively. Thus, the first sacrificial layer 204 can be an epitaxially grown sacrificial layer which can be selectively removed without removing one or more adjoining layers. The offsetting layer 206 is formed over the first sacrificial layer 204. The offsetting layer 206 can include a different material than the first material. For example, the offsetting layer 206 can be an epitaxially grown SiGe layer, as discussed above. Thus, the offsetting layer 206 can be selectively etched, relative to one or more adjacent materials, such as the first sacrificial layer 204 and the substrate 202.

Figure 3:
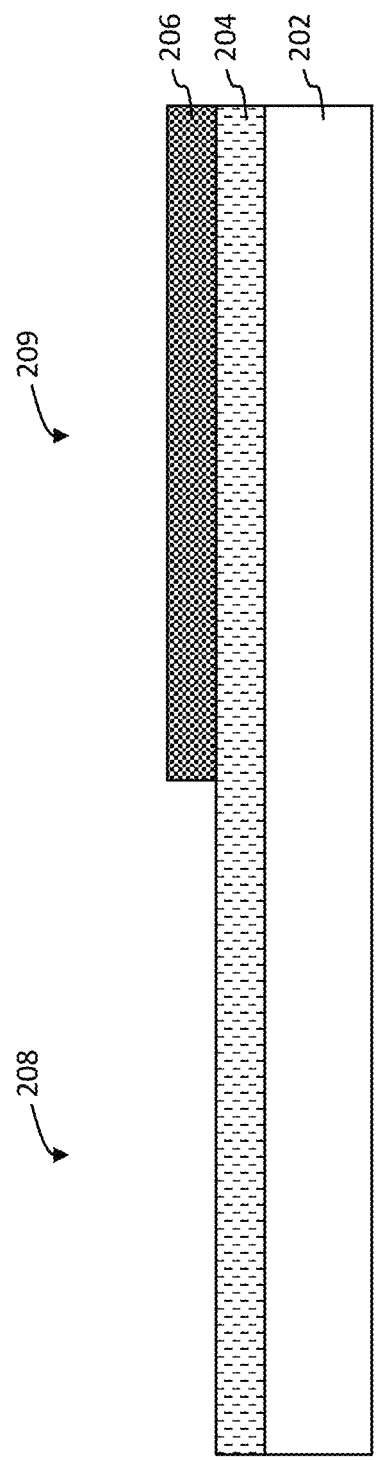
FIG. 3 illustrates a cross-sectional view of a semiconductor device during various fabrication stages, made by the method of FIG. 1, in accordance with some embodiments.

Corresponding to operation 104 of FIG. 1, FIG. 3 is a cross-sectional view of the semiconductor device 200 in which the offsetting layer 206 is removed from a first portion 208 of the substrate 202, in accordance with various embodiments. The substrate 202 can have a plural number of portions configured to form different conductive types of devices, respectively. For example, the first portion 208 may define the footprint for at least one PMOS device, while a second portion 209 where the offsetting layer 206 remains may define the footprint for at least one NMOS device, in some embodiments.

As shown, the offsetting layer 206 over the first portion 208 is removed by directionally etching the surface of the semiconductor device 200 toward the first sacrificial layer 204. For example, a mask (not depicted) can define the first portion 208. To etch the first portion, a first patternable layer (e.g., a photoresist material) can be formed over the surface of the semiconductor device 200. The layers of the semiconductor device 200 can be etched toward the top of the first sacrificial layer 204. For example, the etchant can be timed to etch to the first sacrificial layer 204, the first sacrificial layer 204 can be non-reactive with the etchant, or an etch stop layer can be disposed along a surface of the first sacrificial layer 204. The etching process may be anisotropic and/or isotropic. The photoresist material can be stripped from the semiconductor device 200.

Figure 4:
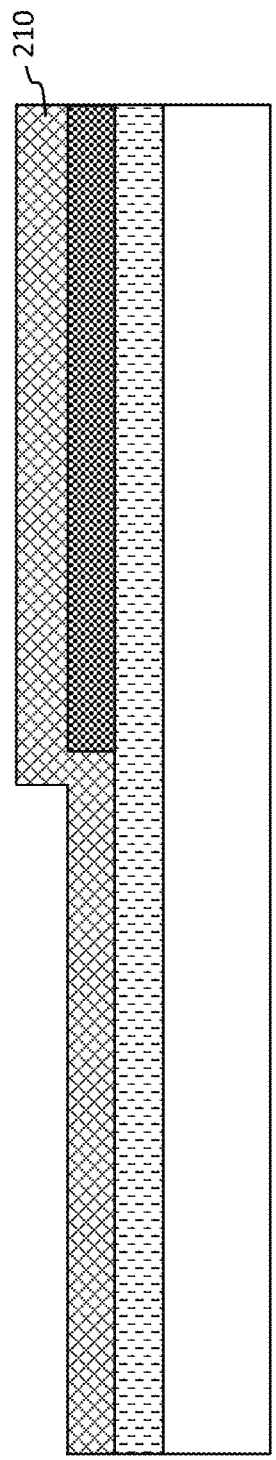
FIG. 4 illustrates a cross-sectional view of a semiconductor device during various fabrication stages, made by the method of FIG. 1, in accordance with some embodiments.
Figure 5:
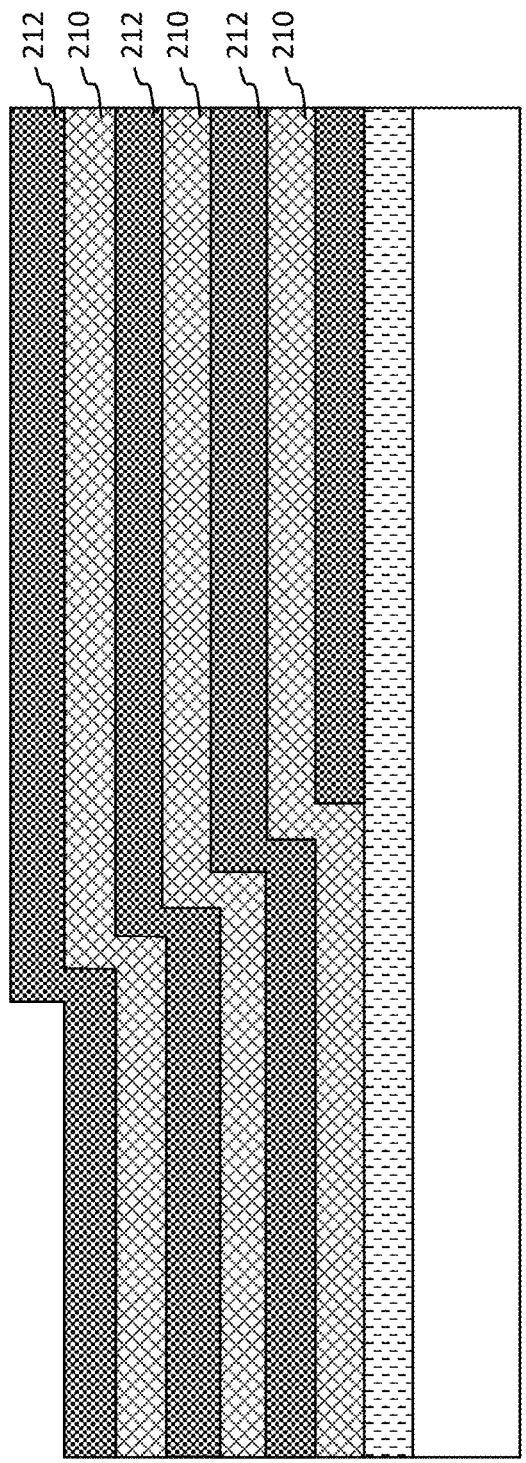
FIG. 5 illustrates a cross-sectional view of a semiconductor device during various fabrication stages, made by the method of FIG. 1, in accordance with some embodiments.

Corresponding to operation 106 of FIG. 1, FIG. 4 and FIG. 5 are each a cross-sectional view of the semiconductor device 200 in which a number of third semiconductor layers 210 of a third material and a number of fourth semiconductor layers 212 of the second material are alternately stacked on top of one another, in accordance with various embodiments.

As shown in FIG. 4, a first (e.g., bottommost) one of the third semiconductor layers 210 is formed over the first portion 208 and the second portion 209 of the substrate 202. As next shown in FIG. 5, a first (e.g., bottommost) one of the fourth semiconductor layers 212 is formed over the bottommost third semiconductor layer 210, a second of the third semiconductor layers 210 is then formed over the bottommost fourth semiconductor layer 212, and so on. Although in the example of FIG. 5, three third semiconductor layers 210 and three fourth semiconductor layers 212 are alternately stacked (with a third one of the fourth semiconductor layers 212 being the topmost layer), it should be understood that such a layer stack can include any number of third semiconductor layers 210 and fourth semiconductor layers 212 alternately stacked while remaining within the scope of the present disclosure. As discussed above, the formation of the various layers of the semiconductor device 200 can include planarization of the layers, such as by cutting, ablation, chemical mechanical grinding or polishing (CMG/P), or other planarization techniques. The semiconductor films 210 and 212 can be or include a material which can be selectively etched, relative to one or more adjacent materials. For example, the third semiconductor layers 210 can be formed from silicon while the fourth semiconductor layers 212 can be formed from silicon germanium. Thus, both the semiconductor layers 210 and 212 can be an epitaxial-grown sacrificial layers which can be selectively removed without removing one or more adjoining layers. For example, the third semiconductor layers 210 can be selectively removed in the first portion 208 of the substrate 202 while the fourth semiconductor layers 212 can be selectively removed in the second portion 209 of the substrate 202.

Figure 6:
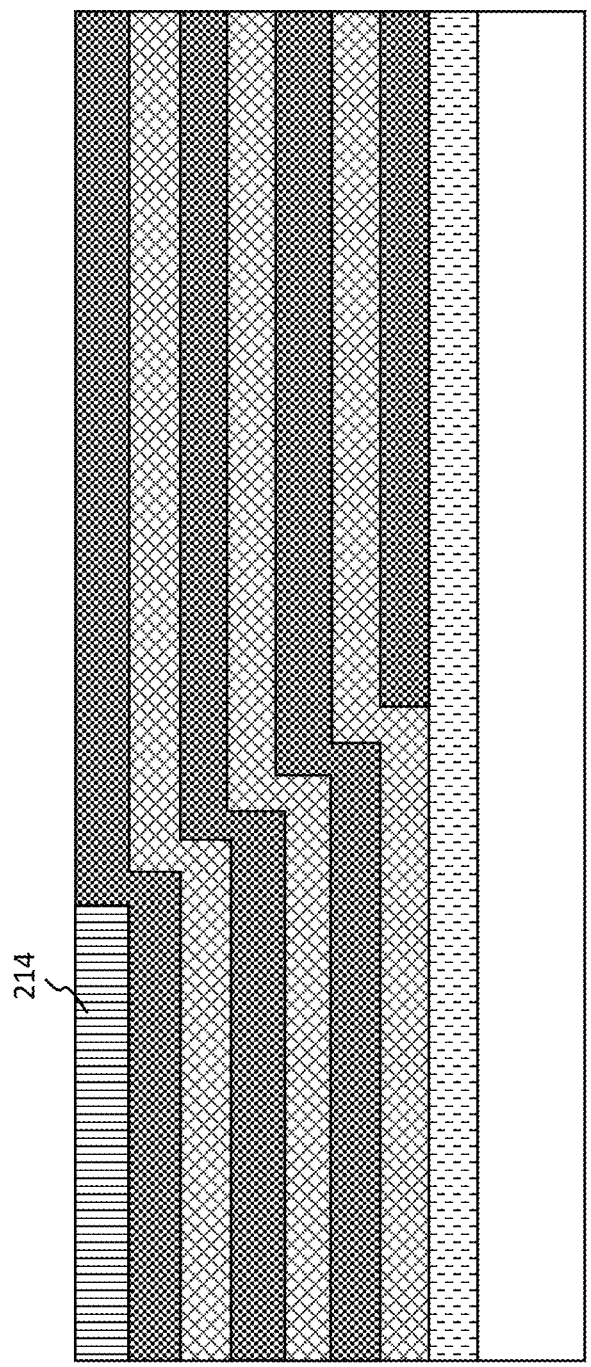
FIG. 6 illustrates a cross-sectional view of a semiconductor device during various fabrication stages, made by the method of FIG. 1, in accordance with some embodiments.
Figure 7:
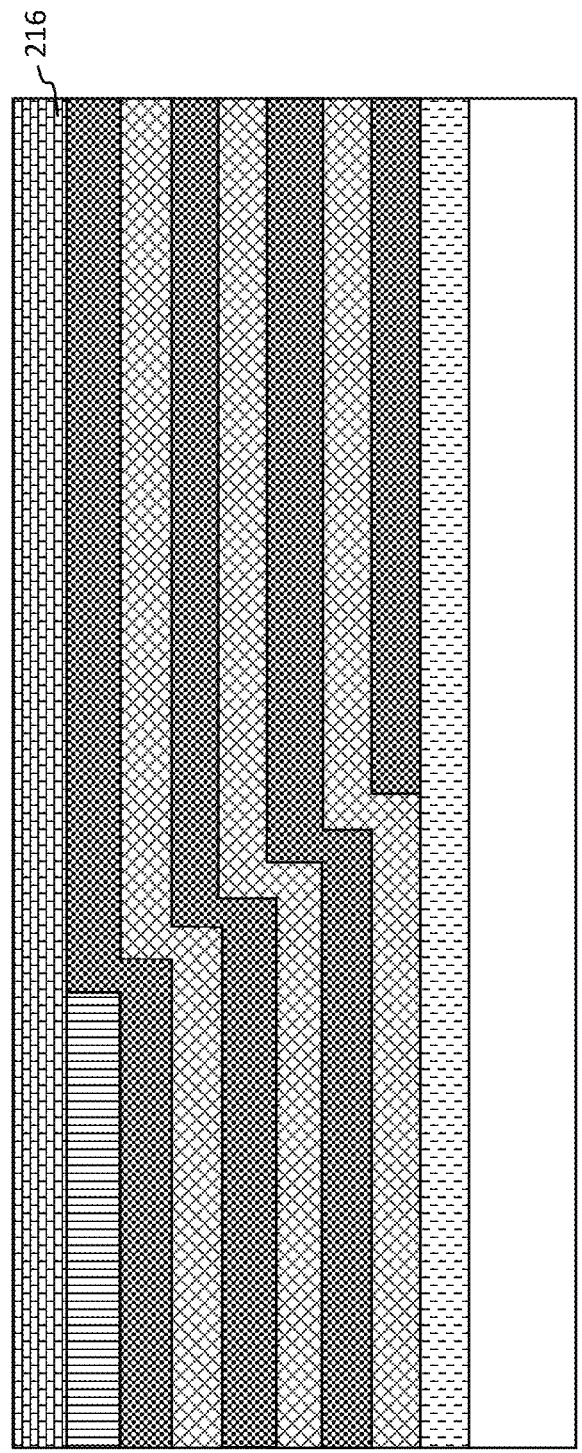
FIG. 7 illustrates a cross-sectional view of a semiconductor device during various fabrication stages, made by the method of FIG. 1, in accordance with some embodiments.

Corresponding to operation 108 of FIG. 1, FIG. 6 and FIG. 7 are cross-sectional views of the semiconductor device 200 in which a second sacrificial layer 214 of a fourth material is formed over the first portion 208 of the semiconductor device 200, and a cap layer 216 of the semiconductor device 200 can be formed (e.g., deposited) over the semiconductor device 200, respectively, in accordance with various embodiments. The second sacrificial layer 214 can be or include a material which can be selectively etched, relative to one or more adjacent materials. For example, the second sacrificial layer 214 can be formed from silicon (e.g., polycrystalline silicon).

The cap layer 216 can serve as a protectant from environmental or processing operations (e.g., the methods disclosed herein). For example, the cap layer 216 can be a hard mask. In some embodiments, additional or fewer sacrificial or semiconductor layers can be formed. For example, although the transistors of the various embodiments disclosed herein are disclosed as tri-gate transistors (e.g., comprising three source/drain layers), transistors may be formed of additional or fewer source/drain layers (e.g., dual-gate transistors or quad-gate transistors). The tri-gate transistors are sometimes referred to as nano-fork or fork-sheet devices.

Figure 8:
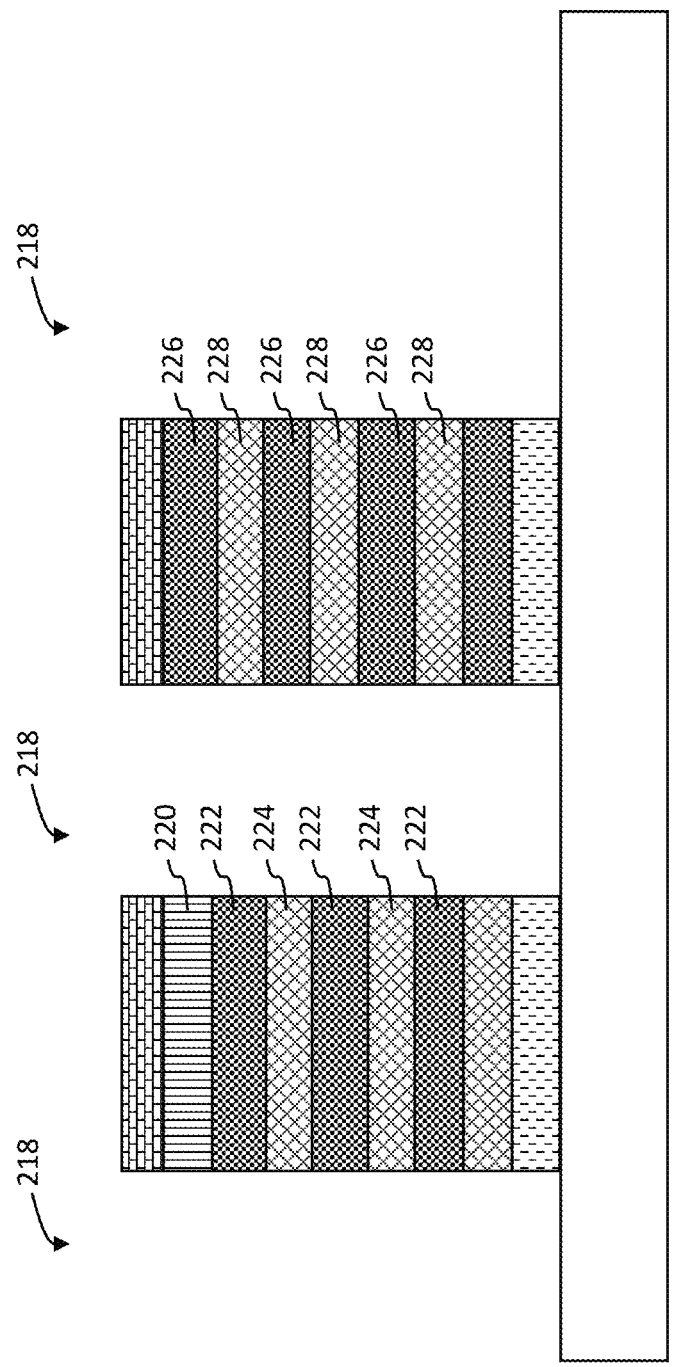
FIG. 8 illustrates a cross-sectional view of a semiconductor device during various fabrication stages, made by the method of FIG. 1, in accordance with some embodiments.
Figure 9:
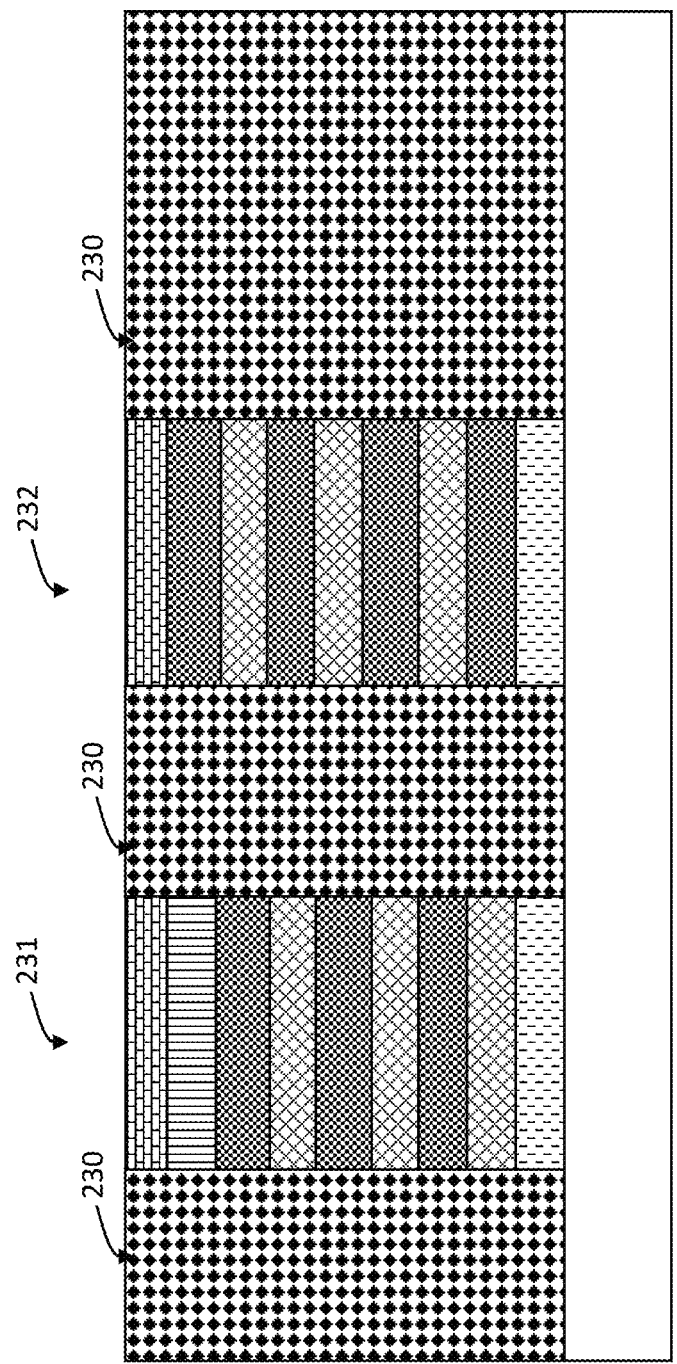
FIG. 9 illustrates a cross-sectional view of a semiconductor device during various fabrication stages, made by the method of FIG. 1, in accordance with some embodiments.

Corresponding to operation 110 of FIG. 1, FIG. 8 and FIG. 9 are cross-sectional views of the semiconductor device 200 in which the stack of the third semiconductor layers 210 and the fourth semiconductor layers 212 are directionally etched, leaving the first semiconductor films 222 and the second semiconductor films 224 over the first portion 208 of the substrate 202 and, the third semiconductor films 228 and the fourth semiconductor films 226 over the second portion 209 of the substrate 202. The etched portions 218 are replaced with a dielectric material 230, in accordance with various embodiments.

Figure 10:
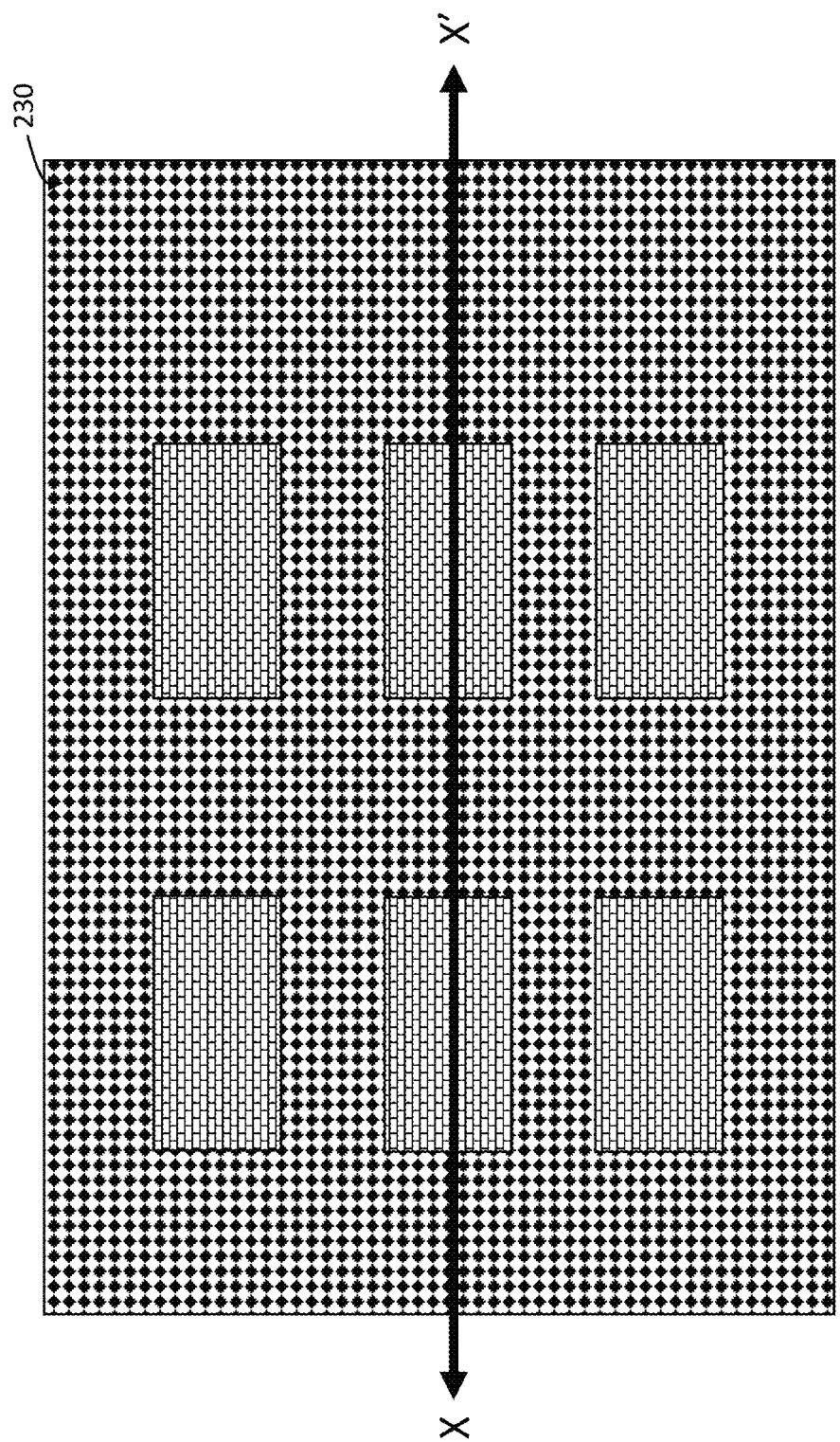
FIG. 10 illustrates a top view of a semiconductor device during various fabrication stages, made by the method of FIG. 1, in accordance with some embodiments.

A mask (not depicted) defines a number of portions 218 of the semiconductor device 200 to be replaced with the dielectric material 230, and the other portions of the semiconductor device 200 to remain. The remaining portions of each nanosheet of the semiconductor device 200 can be referred to herein as nanostructures 231 and 232, respectively. To etch the portion 218, a first patternable layer (e.g., a photoresist material) can be formed over the surface of the semiconductor device 200. The layers of the semiconductor device 200 can be etched to a depth of the substrate 202. For example, the etchant can be timed to etch to the substrate 202, the substrate 202 can be non-reactive with the etchant, or an etch stop layer can be disposed along a surface of the substrate 202. The etching process may be anisotropic and/or isotropic. The photoresist material can be stripped from the semiconductor device 200, and a body dielectric 230 (also referred to herein as a dielectric structure) can be formed in an etched area. For example, the body dielectric 230 can be formed by a deposition process (e.g., CVD), or another fill process and any dielectric disposed over at a level above the cap layer 216 (e.g., the hard mask) can be removed by a planarization process such as CMG/P. The etching can leave vertical structures (e.g., columns or transistor core stacks) of the plurality of nanostructures. For example, a plurality of vertical structures can be formed at regular interval to form a device wherein at least one transistor pair is formed from each of the depicted nanostructures. FIG. 10 is a top view of the semiconductor device depicted in FIG. 9, in accordance with various embodiments.

Figure 11:
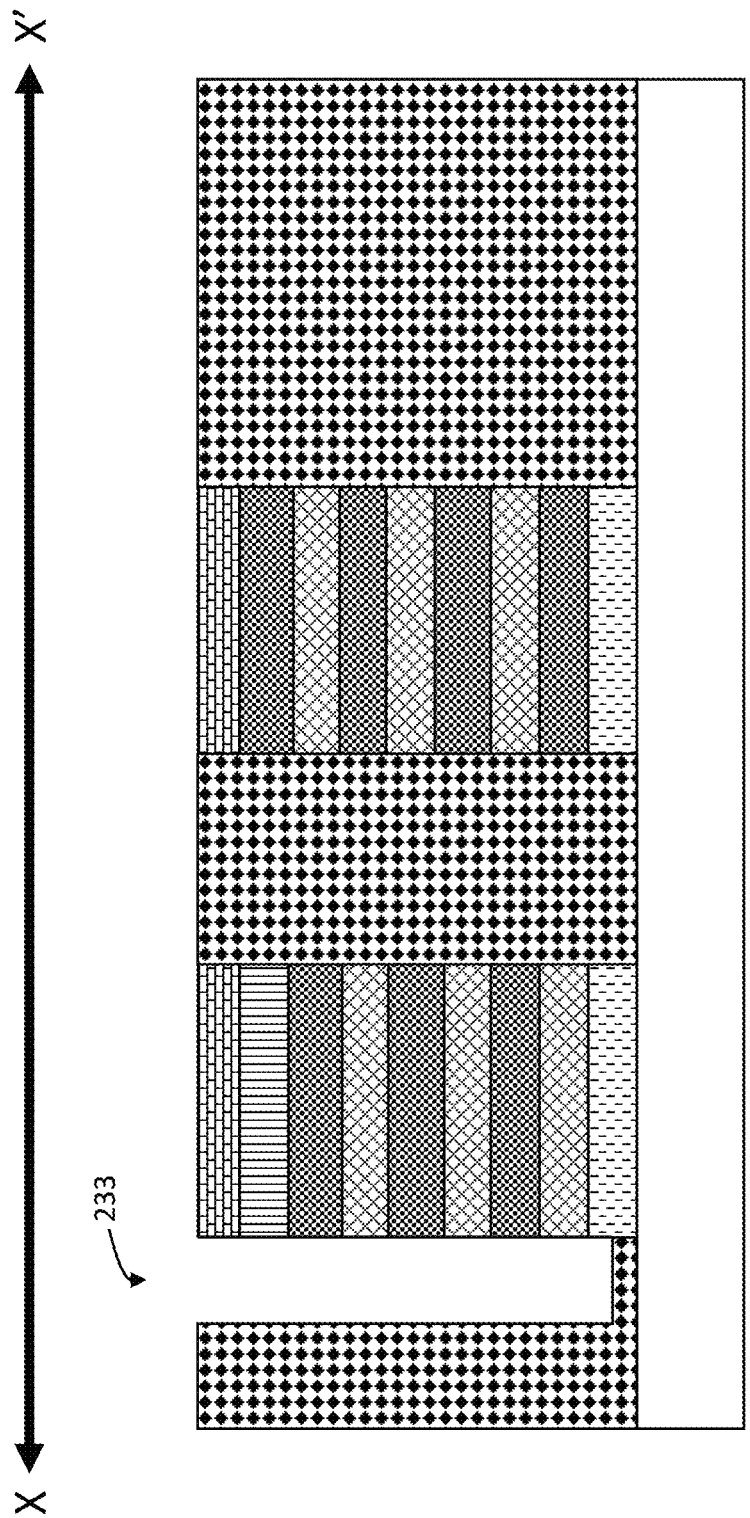
FIG. 11 illustrates a cross-sectional view of a semiconductor device during various fabrication stages, made by the method of FIG. 1, in accordance with some embodiments.
Figure 12:
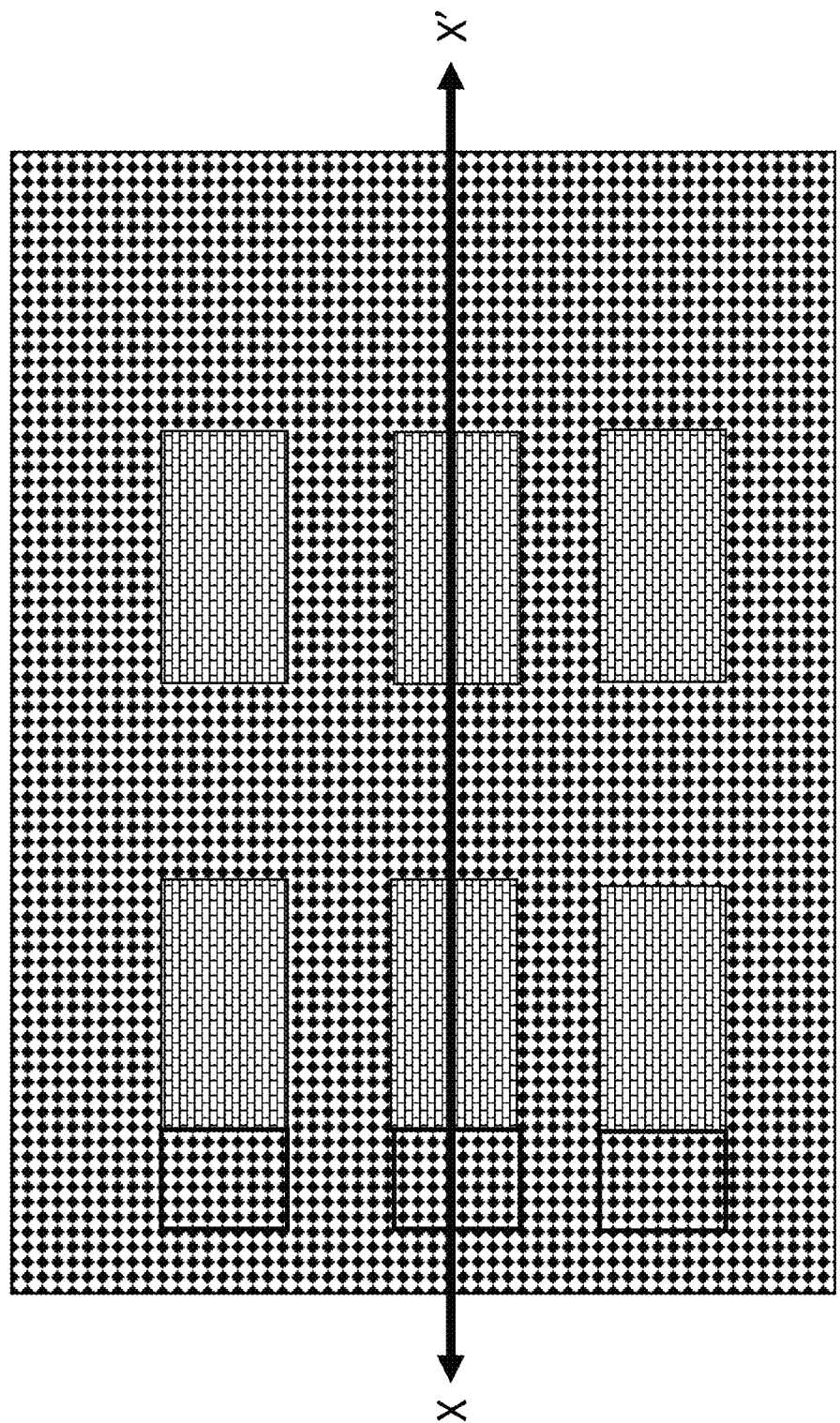
FIG. 12 illustrates a top view of a semiconductor device during various fabrication stages, made by the method of FIG. 1, in accordance with some embodiments.

Corresponding to operation 112 of FIG. 1, FIG. 11 is a cross-sectional view of the semiconductor device 200 in which first openings 233 are formed, in accordance with various embodiments. As shown in FIG. 11, the first openings 233 are formed in the semiconductor device 200 by directionally etching the surface of the semiconductor device 200 toward the depth of in-between the first sacrificial layer 204 and the substrate 202. For example, a mask (not depicted) can define the openings, and the openings can thereafter be formed according to a similar operation as operation 110. The first openings 233 can be disposed along one or more layers of the semiconductor device 200. The first openings 233 does not expose the substrate 202 as viewed from the top of the device (e.g., as depicted in FIG. 12).

Figure 13:
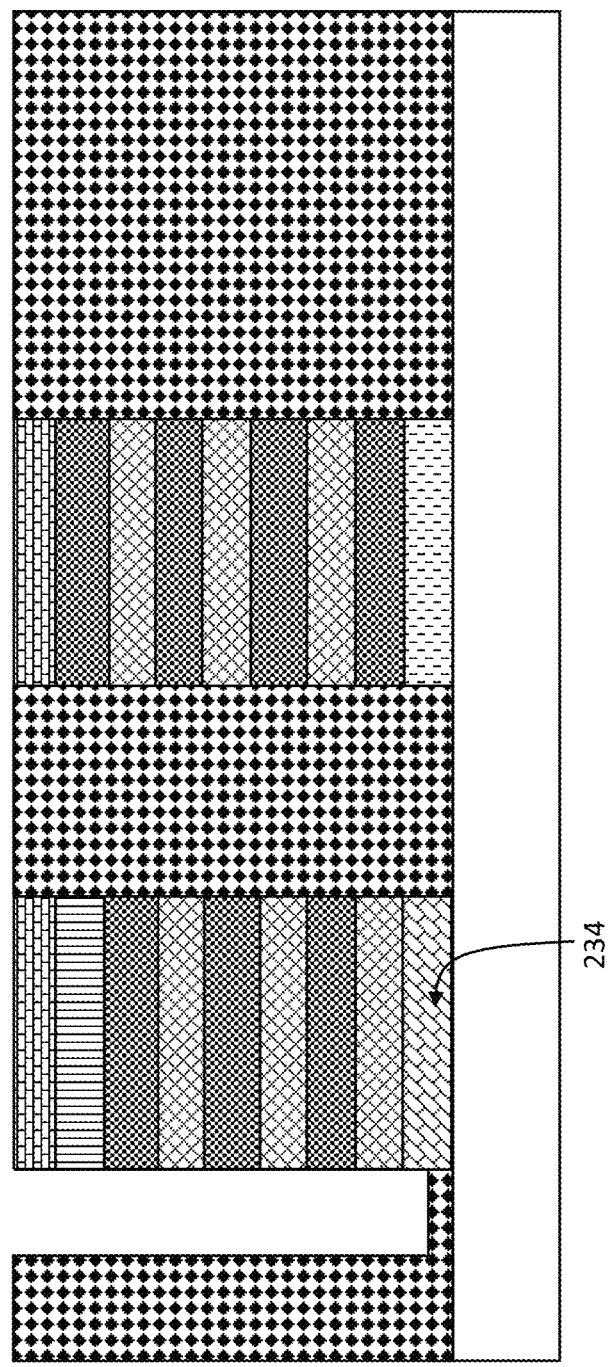
FIG. 13 illustrates a cross-sectional view of a semiconductor device during various fabrication stages, made by the method of FIG. 1, in accordance with some embodiments.

FIG. 13 is a cross-sectional view of the semiconductor device 200 in which one or more semiconductor segments of the semiconductor device 200 are isolated from the substrate 202, in accordance with various embodiments. As shown in FIG. 13, a bottommost layer (e.g., the first sacrificial layer 204) of the semiconductor device 200 near the nanostructure 231 is selectively removed and replaced with a dielectric 222. An etchant can be introduced to the semiconductor device 200 via the first openings 233, and the etchant can thereby access and etch the first sacrificial layer 204 in the nanostructure 231. The removal of the first sacrificial layer 204 can isolate additional layers in the nanostructure 231 of the semiconductor device 200 from the substrate 202. For example, the etchant can be stripped from the semiconductor device 200 to form an air gap between the substrate 202 and the additional layers in the nanostructure 231 of the semiconductor device 200.

In some embodiments, an isolation material 234 can be formed by the evacuation of the material of the first sacrificial layer 204. For example, the isolation material can be a polymer or other dielectric material or semiconductor material, a nano-plane isolating layer, or another isolation material 234. In some embodiments, the isolation material 234 can resist a same etchant or other etchant such as a related etchant used to remove the first sacrificial layer 204. For example, the isolation material 234 can be resistant to an etchant used to remove additional layers of the semiconductor device (e.g., the second semiconductor films 224), as will be further described with reference to FIG. 14.

Figure 14:
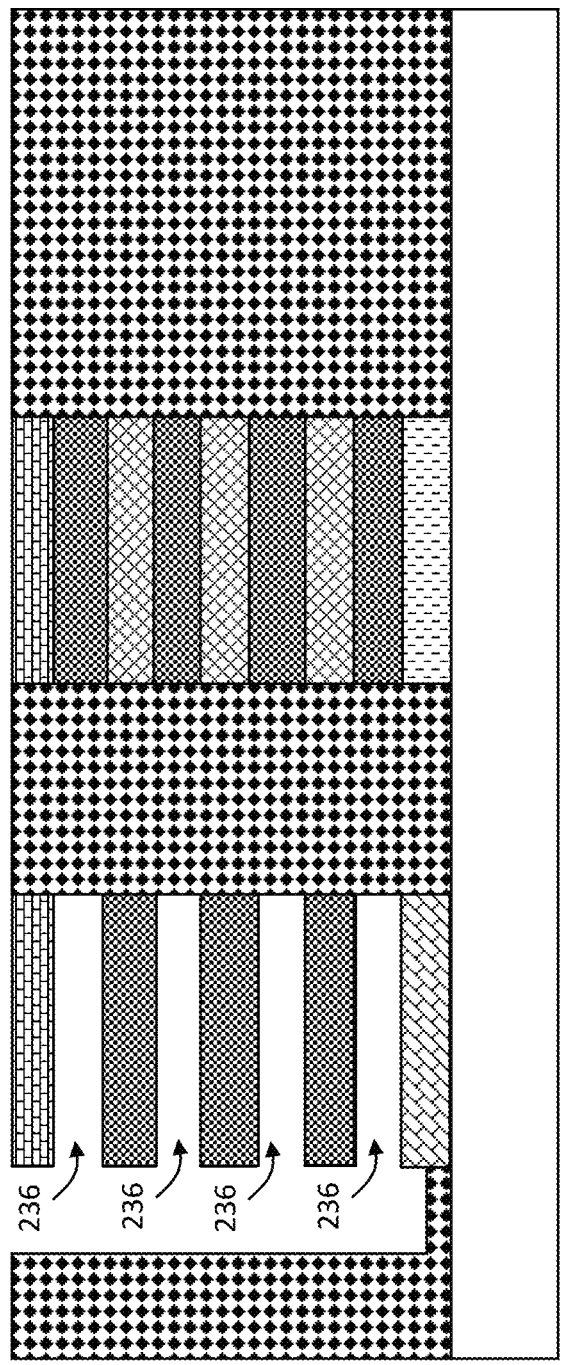
FIG. 14 illustrates a cross-sectional view of a semiconductor device during various fabrication stages, made by the method of FIG. 1, in accordance with some embodiments.

Corresponding to operation 114 of FIG. 1, FIG. 14 is a cross-sectional view of the semiconductor device 200 in which a void 236 is formed, in accordance with various embodiments. Here, the second semiconductor films 224 in the nanostructure 231 are sacrificial layers and are removed from the semiconductor device 200. As shown in FIG. 14, the second semiconductor films 224 in the nanostructure 231 can be etched and removed in similar fashion to the first sacrificial layer 204. For example, an etchant can be introduced through the first openings 233 to remove sacrificial layers disposed vertically adjacent to the remaining semiconductor materials.

The etchant can selectively etch the sacrificial layers, relative to the body dielectric 230, the remaining semiconductor layers (e.g., the first semiconductor films 222 in the nanostructure 231), and the isolation material 234. The selectivity can be based on the material properties of a bulk material or can be based on one or more intermediate layers (e.g., oxidation layers or etch stop layers) formed over the various layers and materials thereof.

Figure 15:
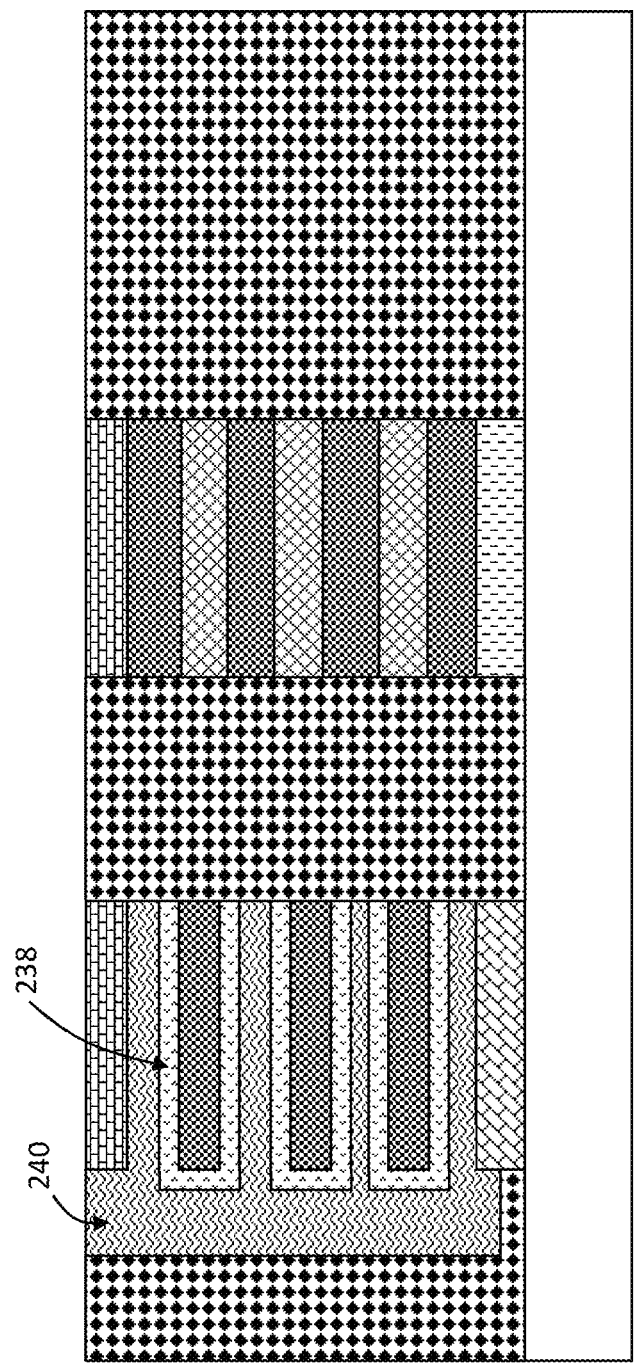
FIG. 15 illustrates a cross-sectional view of a semiconductor device during various fabrication stages, made by the method of FIG. 1, in accordance with some embodiments.

Corresponding to operations 116 of FIG. 1, FIG. 15 is a cross-sectional view of the semiconductor device 200 in which a gate structure is formed.

Figure 16:
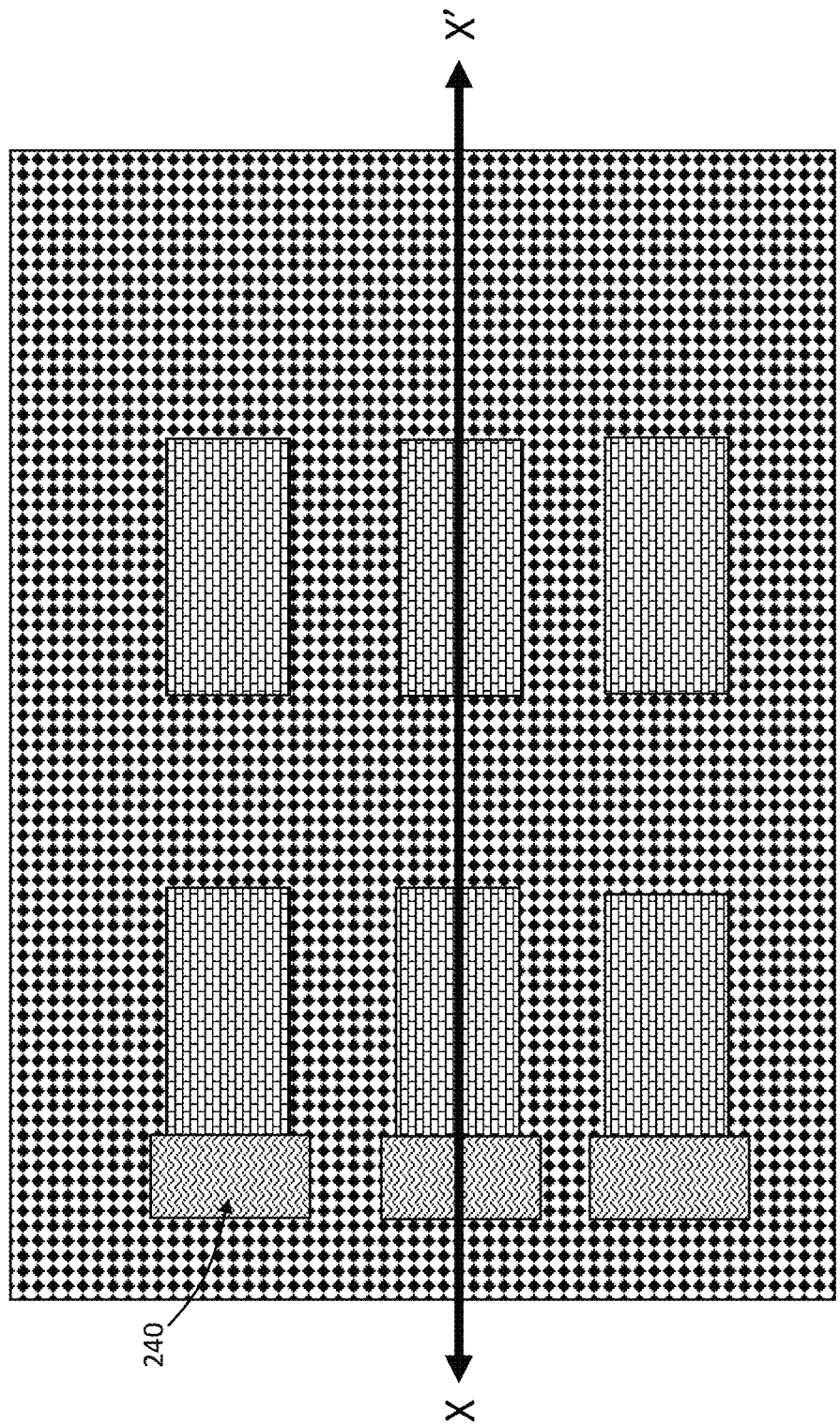
FIG. 16 illustrates a top view of a semiconductor device during various fabrication stages, made by the method of FIG. 1, in accordance with some embodiments.

At operation 116, a gate dielectric 238 is formed over at least a portion of the non-sacrificial semiconductor layers (e.g., the first semiconductor films 222 in the nanostructure 231). The gate dielectric 238 can be a high-k dielectric. The gate dielectric 238 can be configured to selectively adhere to the semiconductor (e.g., silicon germanium) of the semiconductor device 200. As shown, the gate dielectric 238 can cover a first portion of the at least some portions of the non-sacrificial semiconductor layers. A second portion 209 of the non-sacrificial semiconductor layers may not be covered by the gate dielectric 238. For example, each of the first semiconductor films 222 can be vertically bounded by the gate dielectric 238, and may interface with the body dielectric 230, such that the transistors described herein may not be a gate-all-around transistor. FIG. 16 is a top view of the semiconductor device depicted in FIG. 15, in accordance with various embodiments.

At operation 116, a gate electrode 240 is formed over the gate dielectric 238. The gate can be selectively formed over the gate dielectric 238, or can be formed by another process. For example, one or more metal materials (e.g., alloys, coatings, or elements) can be grown along the gate dielectric 238. In some embodiments, the gate electrode 240 is deposited to fill the first openings 233 and the upper surface of the semiconductor device 200 is thereafter planarized. The gate electrode 240 can be a metal gate electrode. For example, the gate electrode 240 can include cobalt, copper, aluminum, silver, gold, tungsten, the like, or alloys or other combinations (e.g., layers) thereof. The gate electrode 240 can fill the first openings 233 or any evacuated portion of the semiconductor device 200 connected thereto. For example, the gate electrode 240 can fill the recesses evacuated by material removed from the offsetting layers 206, such that the gate electrode 240 can encapsulate the gate dielectric 238. The gate electrode 240 can include a plurality of horizontal portions and at least one vertical portion to connect the horizontal portions. As depicted in FIG. 15, at an interface between the nanostructure and the body dielectric 230, the gate electrode 240 can extend to a same lateral dimension as the gate dielectric 238, such that the interface between the gate dielectric 238 and the body dielectric 230 is maintained (e.g., the gate dielectric 238 and the body dielectric 230 may directly interface).

Figure 17:
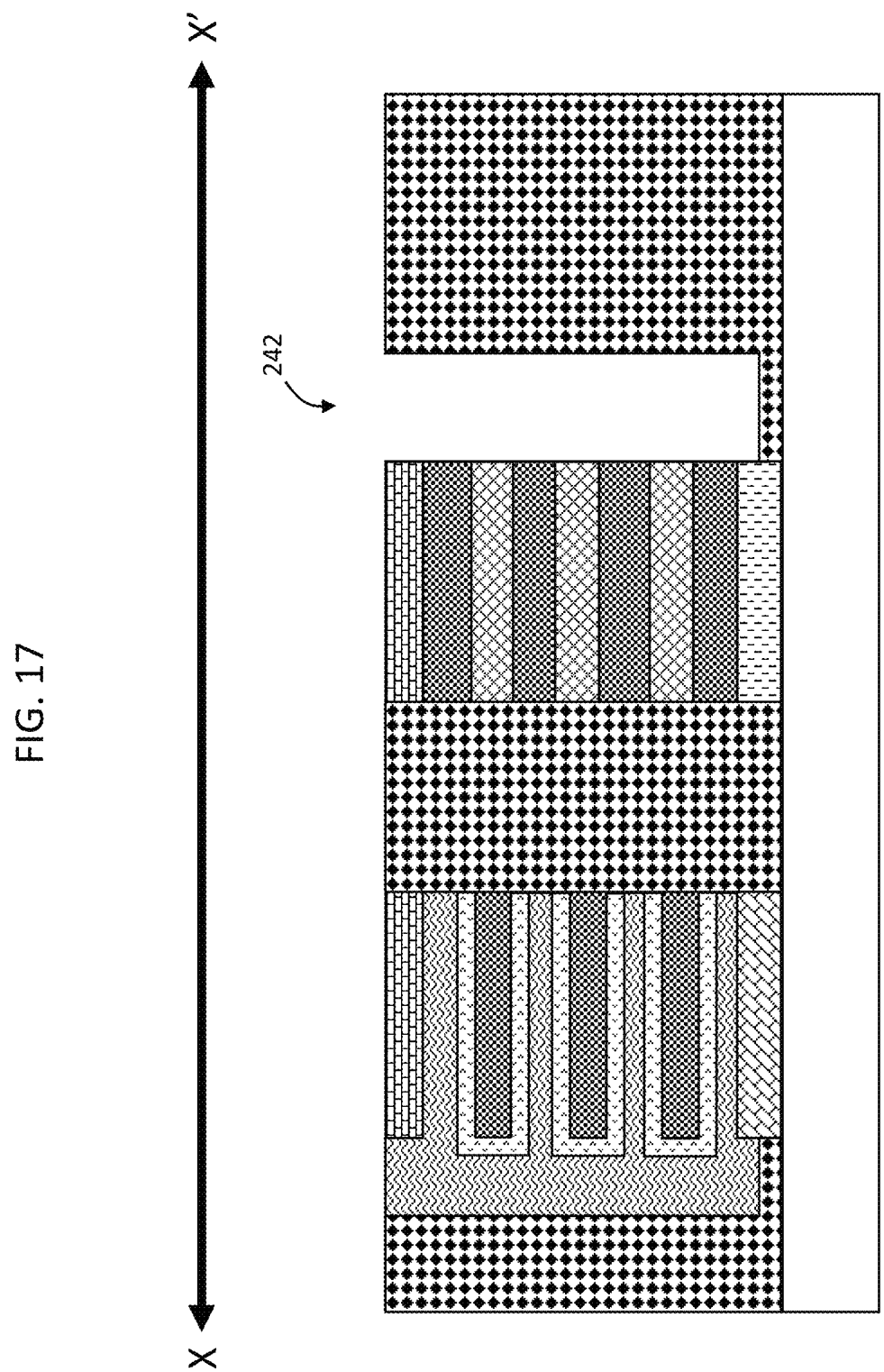
FIG. 17 illustrates a cross-sectional view of a semiconductor device during various fabrication stages, made by the method of FIG. 1, in accordance with some embodiments.
Figure 18:
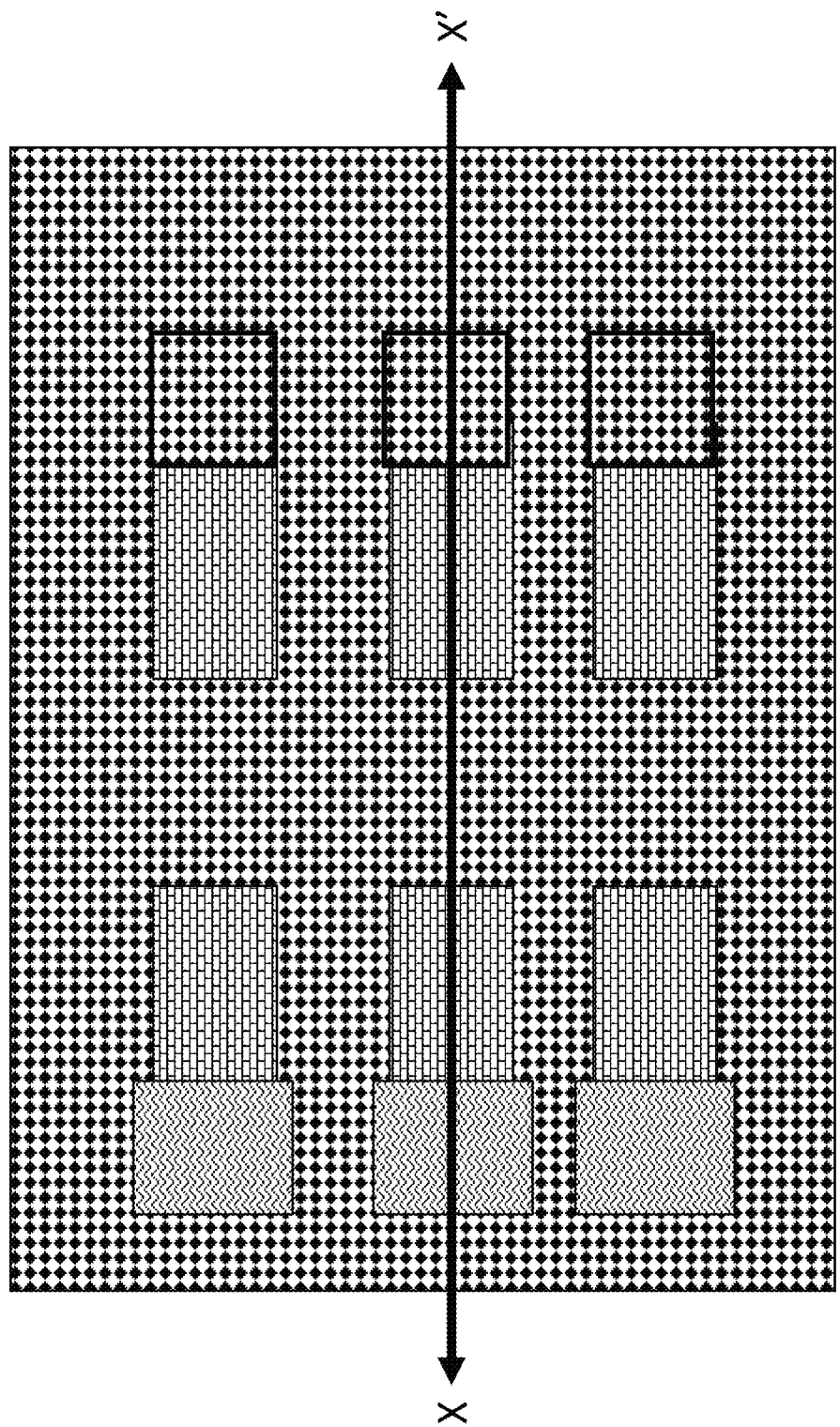
FIG. 18 illustrates a top view of a semiconductor device during various fabrication stages, made by the method of FIG. 1, in accordance with some embodiments.

Corresponding to operation 118 of FIG. 1, FIG. 17 is a cross-sectional view of the semiconductor device 200 in which second openings 242 are formed near the nanostructure 232 of the semiconductor device 200, in accordance with various embodiments. As shown in FIG. 17, the second openings 242 are formed in the semiconductor device 200 by directionally etching the surface of the semiconductor device 200 toward the depth of in-between the first sacrificial layer 204 and the substrate 202. For example, a mask (not depicted) can define the openings, and the openings can thereafter be formed according to a similar operation as operation 112. The second openings 242 can be disposed along one or more layers of the semiconductor device 200. The second openings 242 may not expose the substrate 202 as viewed from the top of the device (e.g., as depicted in FIG. 18).

Figure 19:
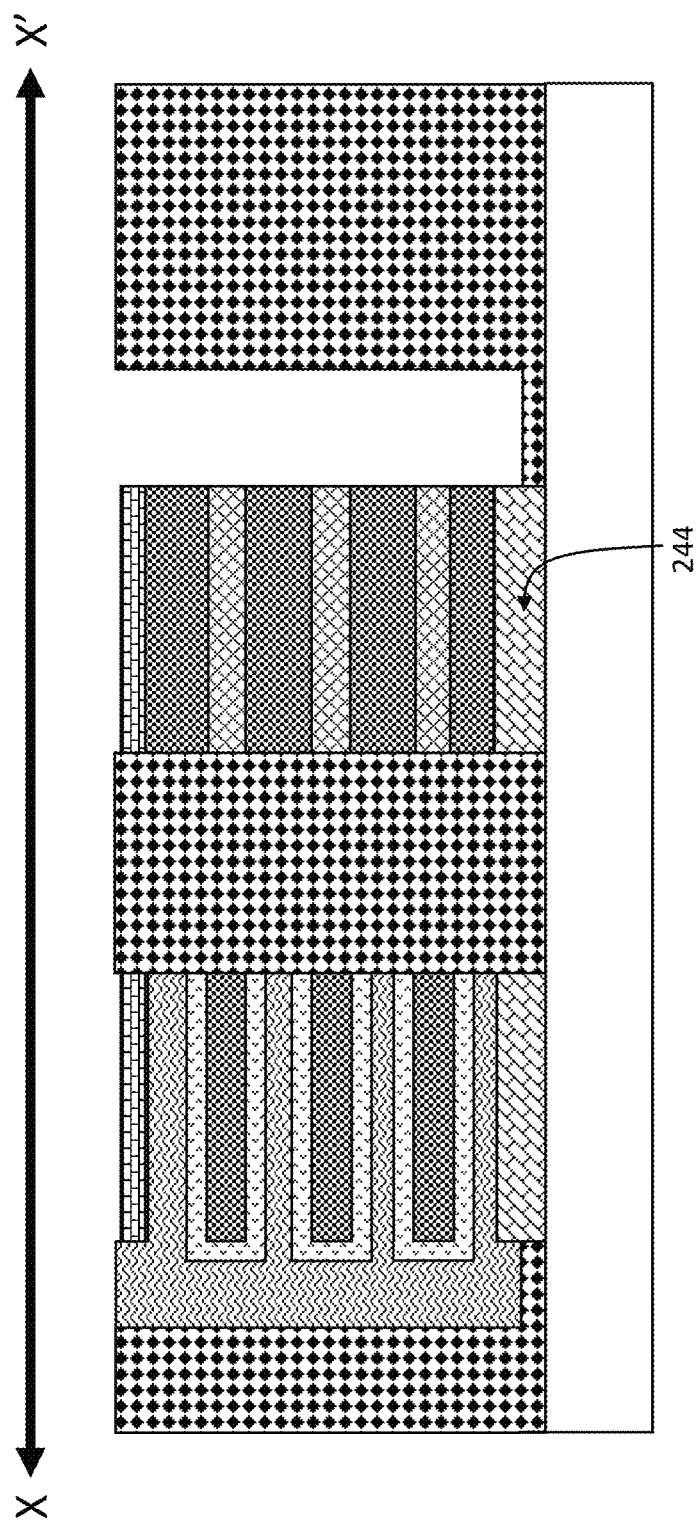
FIG. 19 illustrates a cross-sectional view of a semiconductor device during various fabrication stages, made by the method of FIG. 1, in accordance with some embodiments.

FIG. 19 is a cross-sectional view of the semiconductor device 200 in which one or more semiconductor segments of the semiconductor device 200 are isolated from the substrate 202, in accordance with various embodiments. As shown in FIG. 19, a bottommost layer (e.g., the first sacrificial layer 204) of the semiconductor device 200 in the nanostructure 232 of the semiconductor device 200 is selectively removed and replaced with a dielectric 244. An etchant can be introduced to the semiconductor device 200 via the second openings 242, and the etchant can thereby access and etch the first sacrificial layer 204 of the semiconductor device 200 in the nanostructure 232 of the semiconductor device 200. The removal of the first sacrificial layer 204 can isolate additional layers in the nanostructure 232 of the semiconductor device 200 from the substrate 202. For example, the etchant can be stripped from the semiconductor device 200 to form an air gap between the substrate 202 and the additional layers in the nanostructure 232 of the semiconductor device 200.

In some embodiments, an isolation material 244 can be formed by the evacuation of the material of the first sacrificial layer 204. For example, the isolation material can be a polymer or other dielectric material or semiconductor material, a nano-plane isolating layer, or another isolation material 244. In some embodiments, the isolation material 244 can resist a same etchant or other etchant such as a related etchant used to remove the first sacrificial layer 204. For example, the isolation material 244 can be resistant to an etchant used to remove additional layers of the semiconductor device (e.g., the offsetting layer 206 or the fourth semiconductor films 226), as will be further described with reference to FIG. 20.

Figure 20:
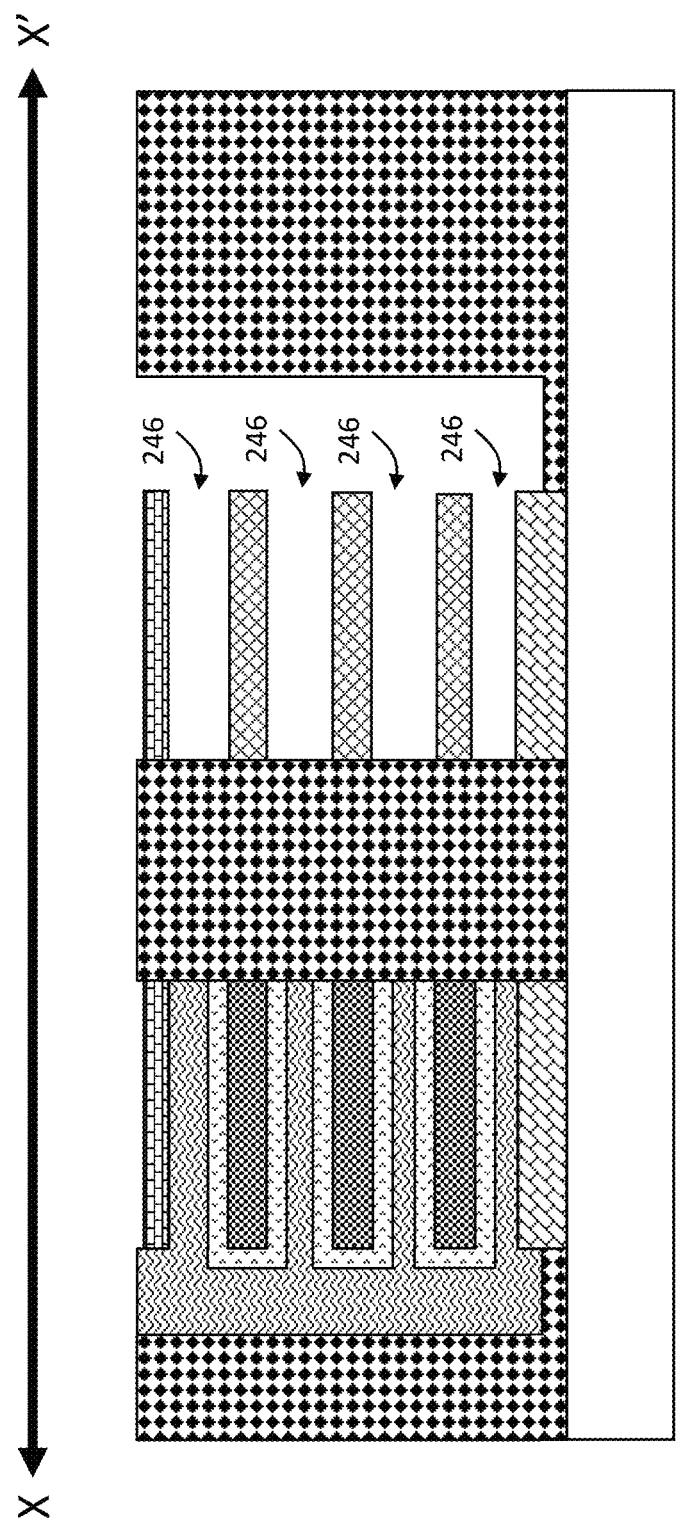
FIG. 20 illustrates a cross-sectional view of a semiconductor device during various fabrication stages, made by the method of FIG. 1, in accordance with some embodiments.

Corresponding to operation 120 of FIG. 1, FIG. 20 is a cross-sectional view of the semiconductor device 200 in which a void 246 is formed, in accordance with various embodiments. Here, the fourth semiconductor films 226 in the nanostructure 232 are sacrificial layers and are removed from the semiconductor device 200. As shown in FIG. 20, the offsetting layer 206 and the fourth semiconductor films 226 can be etched and removed in similar fashion to the first sacrificial layer 204. For example, an etchant can be introduced through the second openings 242 to remove sacrificial layers disposed vertically adjacent to the remaining semiconductor materials.

The etchant can selectively etch the sacrificial layers (i.e., the fourth semiconductor films 226), relative to the body dielectric 230, the remaining semiconductor layers (e.g., the third semiconductor films 228 in the nanostructure 232), and the isolation material 244. The selectivity can be based on the material properties of a bulk material or can be based on one or more intermediate layers (e.g., oxidation layers or etch stop layers) formed over the various layers and materials thereof.

Figure 21:
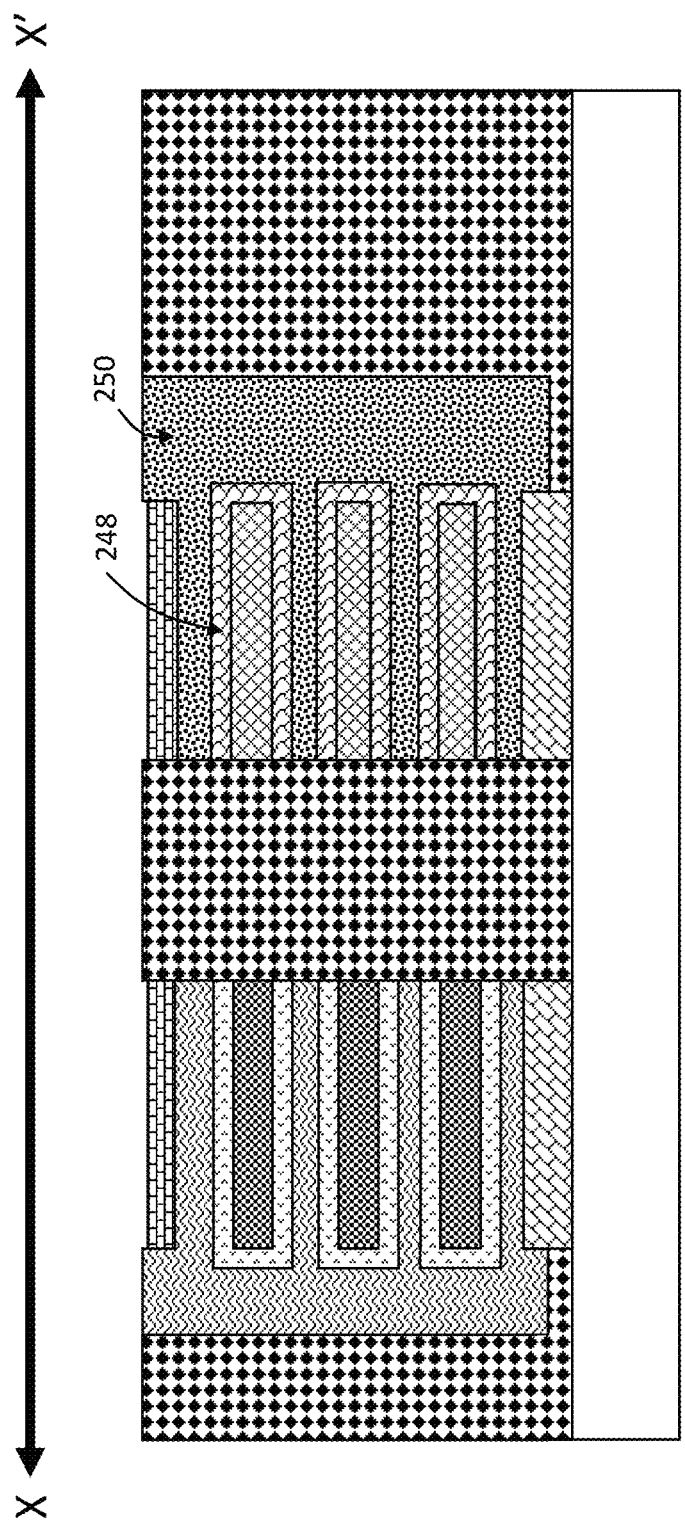
FIG. 21 illustrates a cross-sectional view of a semiconductor device during various fabrication stages, made by the method of FIG. 1, in accordance with some embodiments.

Corresponding to operations 122 of FIG. 1, FIG. 21 is a cross-sectional view of the semiconductor device 200 in which a gate structure is formed.

At operation 122, a gate dielectric 248 is formed over at least a portion of the non-sacrificial semiconductor layers (e.g., the third semiconductor films 228 in the nanostructure 232). The gate dielectric 248 can be a high-k dielectric. The gate dielectric 248 can be configured to selectively adhere to the semiconductor (e.g., silicon) of the semiconductor device 200. As shown, the gate dielectric 248 can cover a first portion of the at least some portions of the non-sacrificial semiconductor layers. A first portion 208 of the non-sacrificial semiconductor layers may not be covered by the gate dielectric 248. For example, each of the third semiconductor films 228 can be vertically bounded by the gate dielectric 248, and may interface with the body dielectric 230, such that the transistors described herein may not be a gate-all-around transistor).

Figure 22:
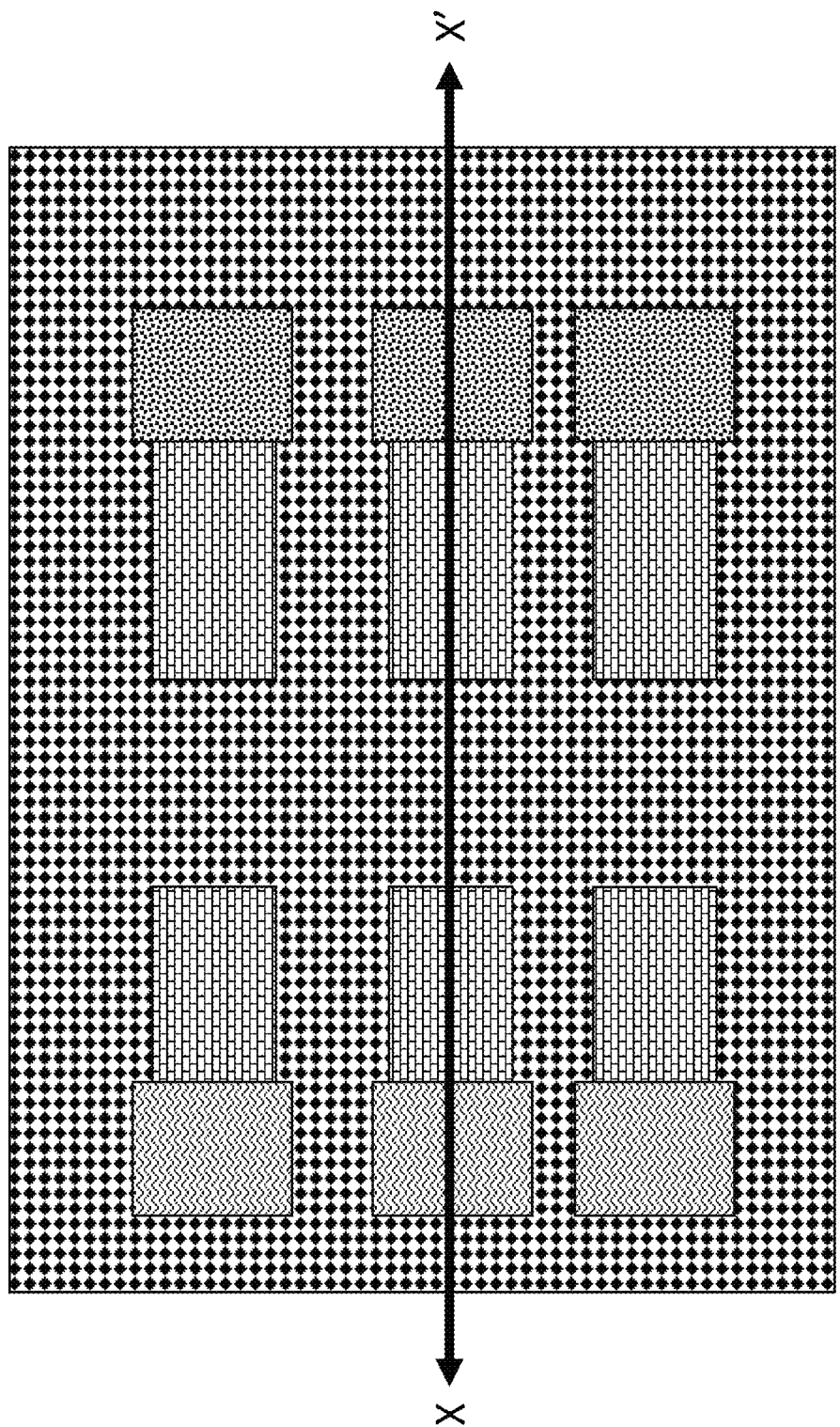
FIG. 22 illustrates a top view of a semiconductor device during various fabrication stages, made by the method of FIG. 1, in accordance with some embodiments.

At operation 122, a gate electrode 250 is formed over the gate dielectric 248. The gate can be selectively formed over the gate dielectric 248, or can be formed by another process. For example, one or more metal materials (e.g., alloys, coatings, or elements) can be grown along the gate dielectric 248. In some embodiments, the gate electrode 250 is deposited to fill the second openings and the upper surface of the semiconductor device 200 is thereafter planarized. The gate electrode 250 can be a metal gate electrode. For example, the gate electrode can include cobalt, copper, aluminum, silver, gold, tungsten, the like, or alloys or other combinations (e.g., layers) thereof. The gate electrode 250 can fill the second openings 242 or any evacuated portion of the semiconductor device 200 connected thereto. For example, the gate electrode 250 can fill the recesses evacuated by material removed from the first sacrificial layers 204, such that the gate electrode 250 can encapsulate the gate dielectric 248. The gate electrode can include a plurality of horizontal portions and at least one vertical portion to connect the horizontal portions. As depicted in FIG. 21, at an interface between the nanostructure and the body dielectric 230, the gate electrode 250 can extend to a same lateral dimension as the gate dielectric 248, such that the interface between the gate dielectric 248 and the body dielectric 230 is maintained (e.g., the gate dielectric 248 and the body dielectric 230 may directly interface). FIG. 22 is a top view of the semiconductor device depicted in FIG. 21, in accordance with various embodiments.

Figure 23:
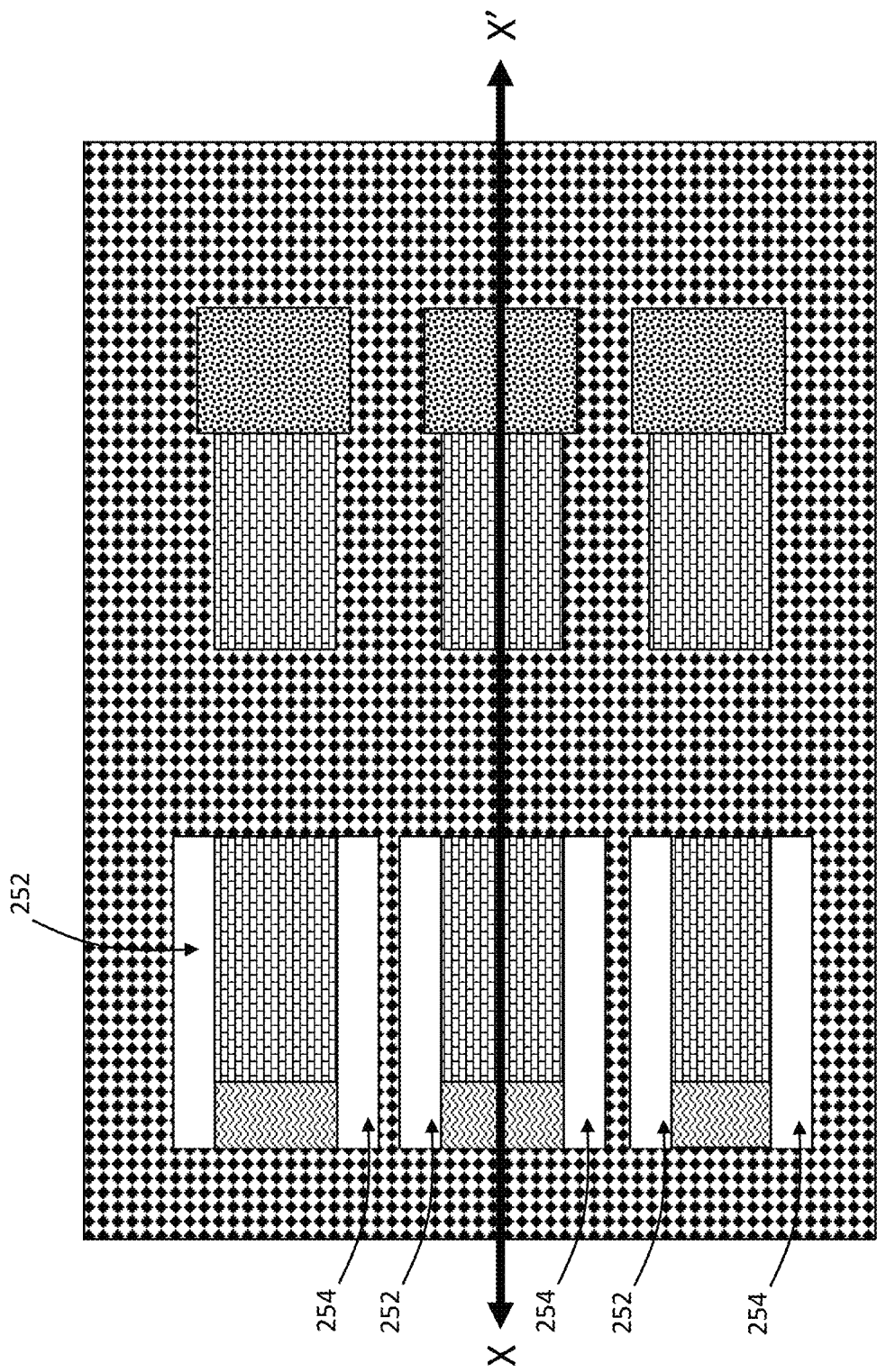
FIG. 23 illustrates a top view of a semiconductor device during various fabrication stages, made by the method of FIG. 1, in accordance with some embodiments.

With further reference to FIG. 23, source regions 252 and drain regions 254 in the nano structure 231 can be defined. In some embodiments, the source regions 252 or drain regions 254 can be involved in similar process operations, such they may be referred to collectively as source/drain regions 252, 254. Although the operations may be similar, the source region 252 and drain region 254 may undergo asymmetric variants of the processes. For example, an etching depth, dopant used, or concentration thereof, and the like, can be performed symmetrically or asymmetrically between the source/drain regions 252, 254. The channel regions may also be referred to as semiconductor channels. At operation 124, the gate electrodes 240 are selectively horizontally etched. The first semiconductor films 222 in the nanostructure 231 are recess etched. For example, the etchant can selectively etch one or more portions (e.g., coatings or thicknesses) of the gate electrode 240 (e.g., can be material specific or time or volume controlled to etch a defined lateral distance of the respective layers). The recess etching laterally reduces the dimension of the gate electrode 240. The reduction in lateral dimension can create isolation between the source/drain regions 252 and 254 (e.g., source/drain regions 252, 254 laterally defined by the recession of the gate electrode 240) and the channel regions (i.e., the first semiconductor films 222 in the nanostructure 231).

Figure 24:
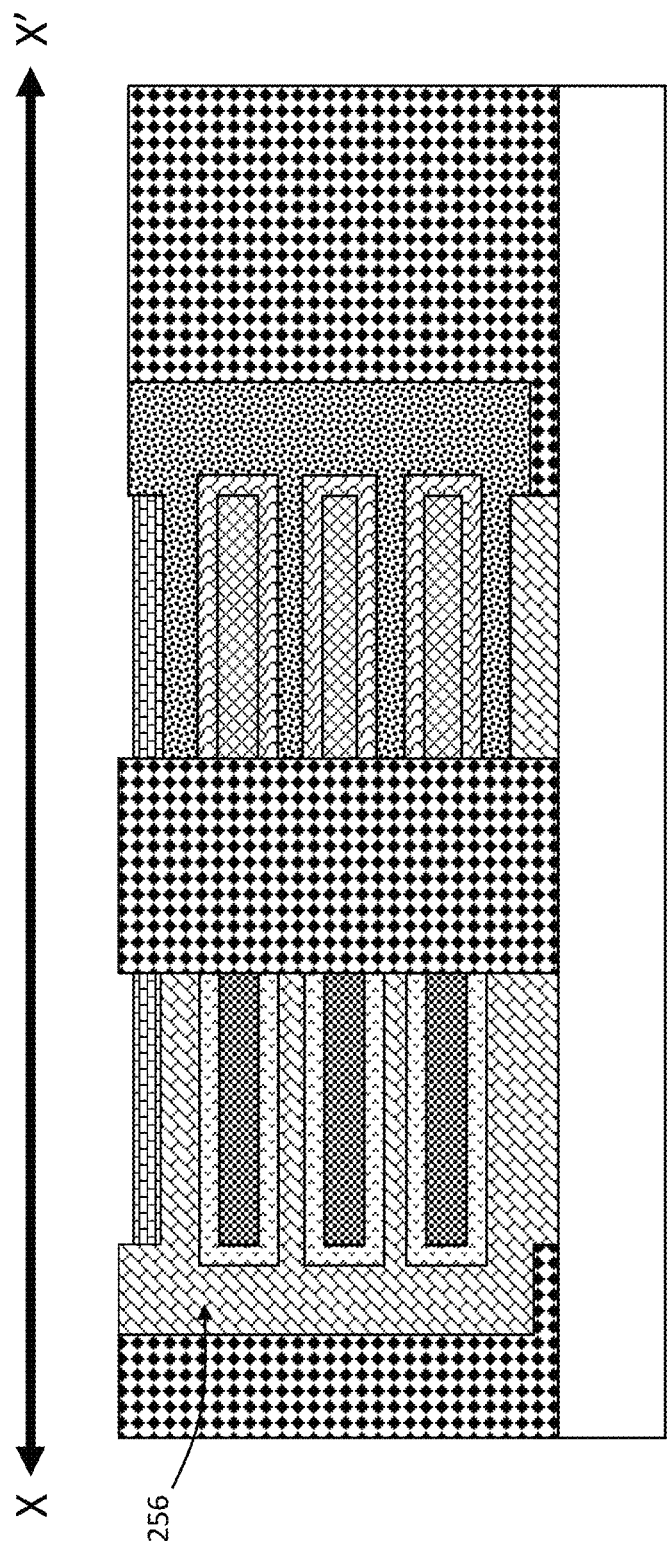
FIG. 24 illustrates a cross-sectional view of a semiconductor device during various fabrication stages, made by the method of FIG. 1, in accordance with some embodiments.

Corresponding to operation 124 of FIG. 1, FIG. 24 is a cross-sectional view of the semiconductor device 200 in which a portion of the gate electrode 240 is replaced with a dielectric 256. In some embodiments, the gate insulating dielectric 256 can be a same dielectric as the body dielectric 230. In some embodiments, the gate insulating dielectric 256 can be another dielectric material. For example, the gate insulating dielectric 256 can be selected according to an isolation voltage, an interfacability with adjoining materials (e.g., resistance to diffusion of adjoining materials), or dielectric constant (e.g., may be a low-k dielectric to reduce a capacitance).

Figure 25:
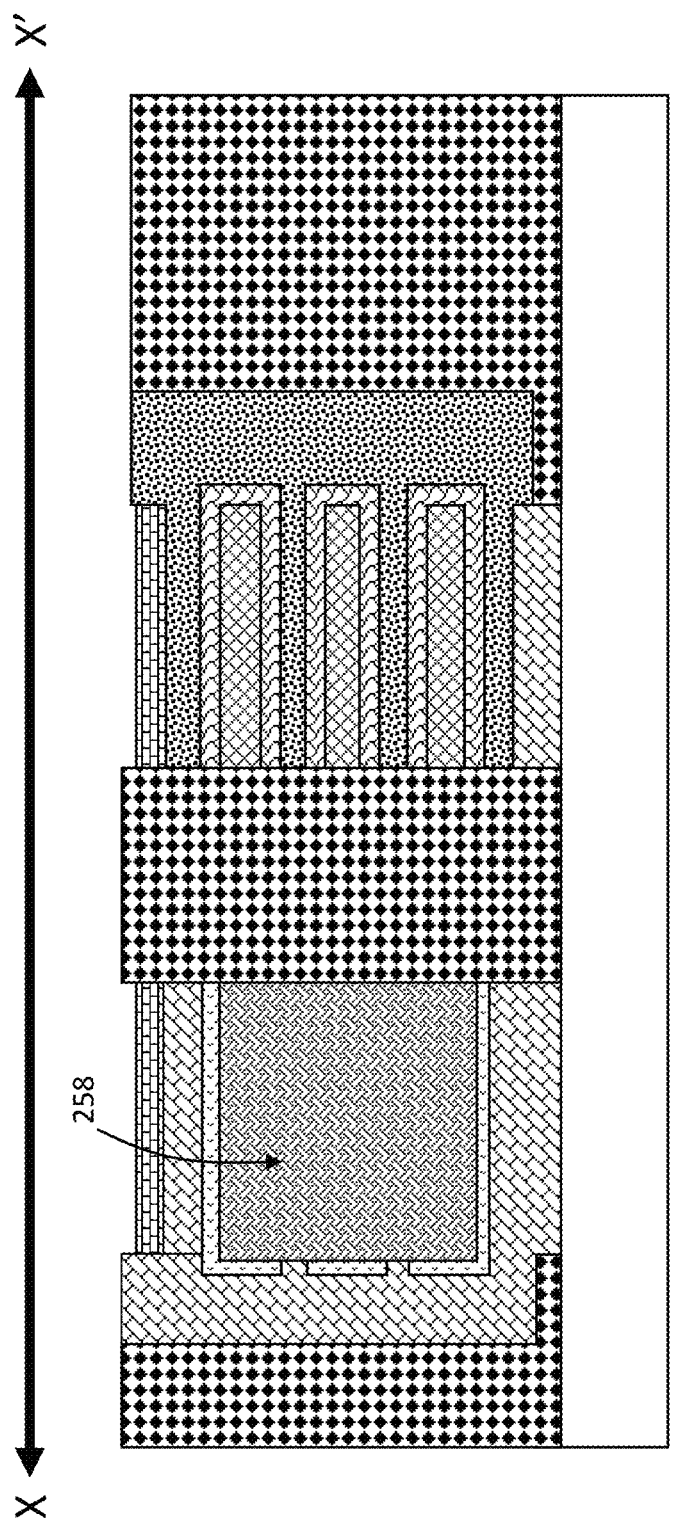
FIG. 25 illustrates a cross-sectional view of a semiconductor device during various fabrication stages, made by the method of FIG. 1, in accordance with some embodiments.
Figure 26:
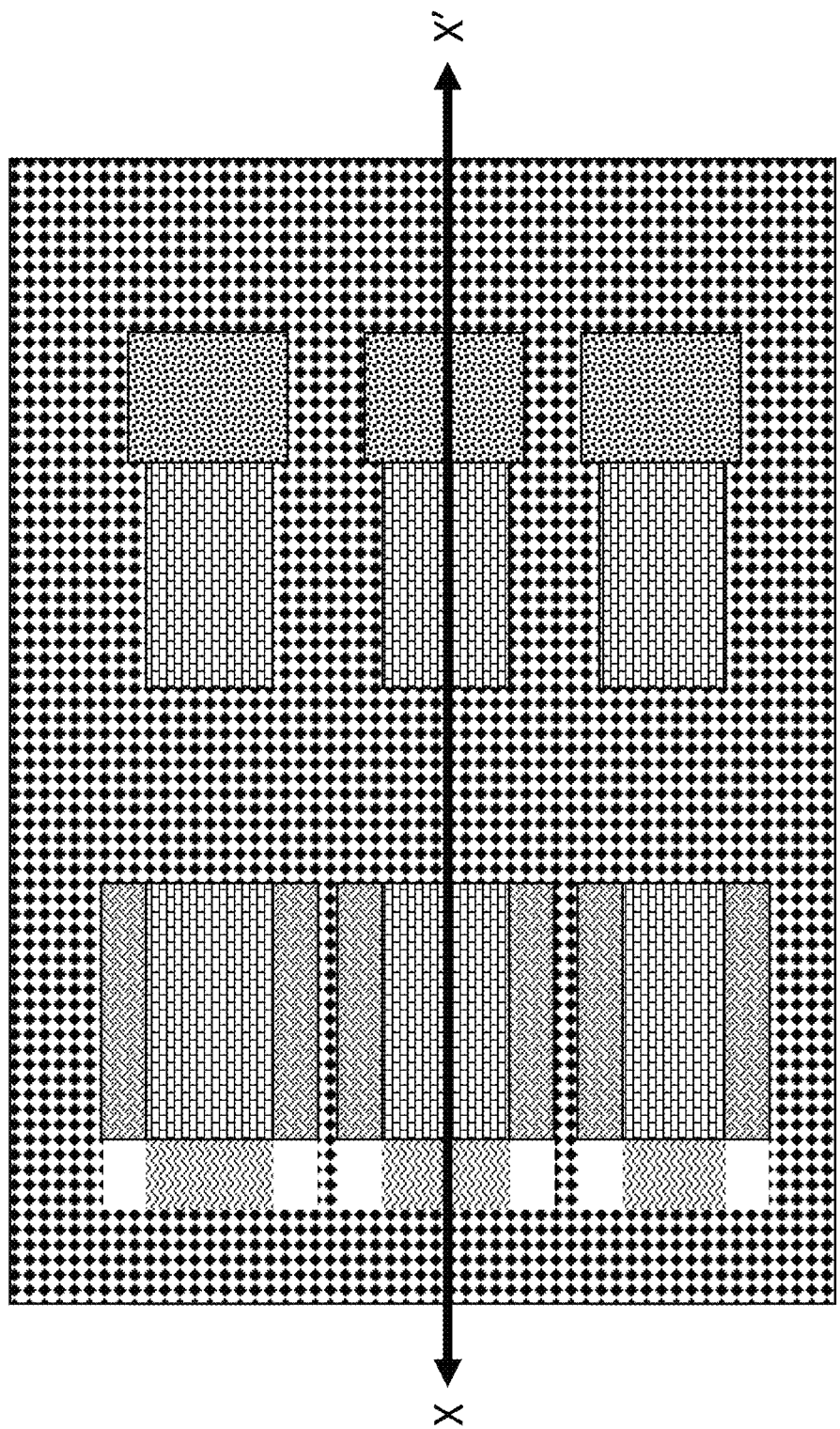
FIG. 26 illustrates a top view of a semiconductor device during various fabrication stages, made by the method of FIG. 1, in accordance with some embodiments.

In another embodiment, corresponding to operation 124 of FIG. 1, FIG. 25 is a cross-sectional view of the semiconductor device 200 in which source and drain regions 258 are formed. For example, the source/drain regions 258 can be or include silicon and additional silicon can be epitaxially grown there-over. FIG. 26 is a top view of the semiconductor device depicted in FIG. 25, in accordance with various embodiments.

Figure 27:
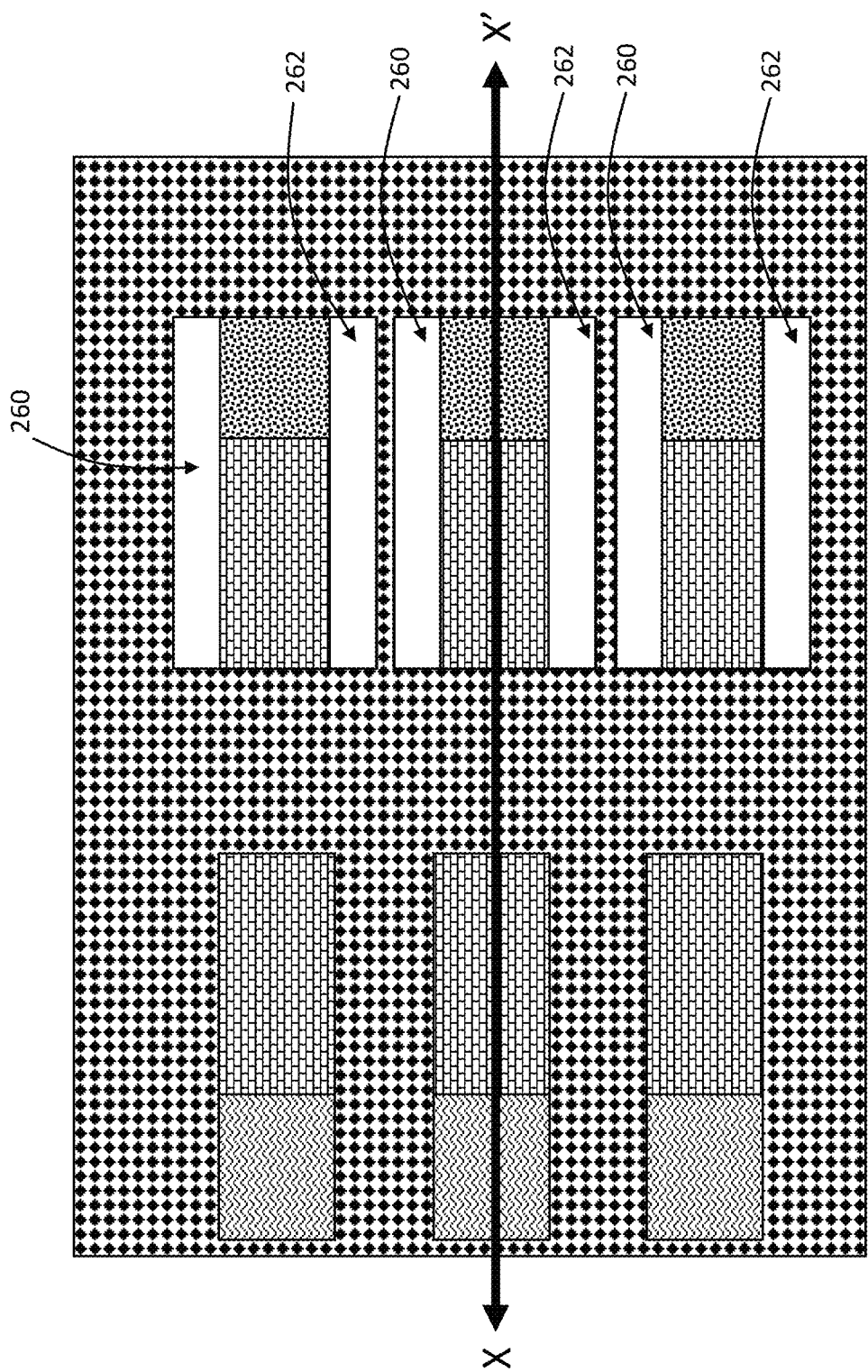
FIG. 27 illustrates a top view of a semiconductor device during various fabrication stages, made by the method of FIG. 1, in accordance with some embodiments.

In another embodiment, corresponding to operation 124 of FIG. 1 and with reference to FIG. 27, source regions 260 and drain regions 262 in the nanostructure 232 can be defined in a similar fashion of the first portion of the semiconductor device 200. In some embodiments, the source regions 260 or drain regions 262 can be involved in similar process operations, such they may be referred to collectively as source/drain regions 260, 262. Although the operations may be similar, the source region 260 and drain region 262 may undergo asymmetric variants of the processes. For example, an etching depth, dopant used, or concentration thereof, and the like, can be performed symmetrically or asymmetrically between the source/drain regions 260, 262. The channel regions may also be referred to as semiconductor channels. At operation 124, the gate electrodes 250 are selectively horizontally etched. The third semiconductor films 228 in the nanostructure 232 are recess etched. For example, the etchant can selectively etch one or more portions (e.g., coatings or thicknesses) of the gate electrode 250 (e.g., can be material specific or time or volume controlled to etch a defined lateral distance of the respective layers). The recess etching laterally reduces the dimension of the gate electrode 250. The reduction in lateral dimension can create isolation between the source/drain regions 260 and 262 (e.g., source/drain regions 260, 262 laterally defined by the recession of the gate electrode 250) and the channel regions (i.e., the third semiconductor films 228 in the nanostructure 232).

Figure 28:
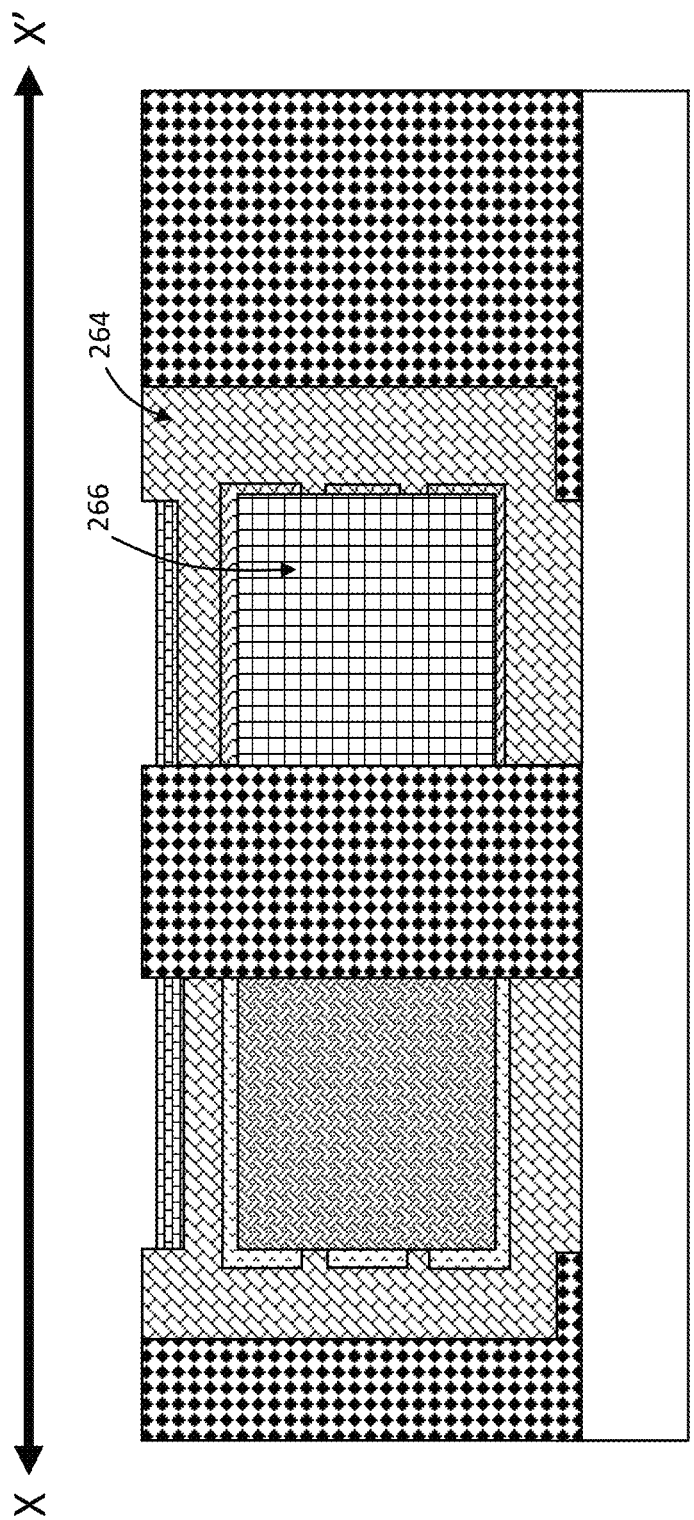
FIG. 28 illustrates a cross-sectional view of a semiconductor device during various fabrication stages, made by the method of FIG. 1, in accordance with some embodiments.

In another embodiment, corresponding to operation 124 of FIG. 1, FIG. 28 is a cross-sectional view of the semiconductor device 200 in which a portion of the gate electrode 250 is replaced with a dielectric 264 and source and drain regions 266 are formed. In some embodiments, the gate insulating dielectric 264 can be a same dielectric as the body dielectric 230. In some embodiments, the gate insulating dielectric 264 can be another dielectric material. For example, the gate insulating dielectric 264 can be selected according to an isolation voltage, an interfacability with adjoining materials (e.g., resistance to diffusion of adjoining materials), or dielectric constant (e.g., may be a low-k dielectric to reduce a capacitance). The source and drain regions 266 can be or include silicon and additional silicon can be epitaxially grown there-over.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
providing a plurality of first semiconductor films and a plurality of second semiconductor films alternately stacked on top of one another and a plurality of third semiconductor films and a plurality of fourth semiconductor films alternately stacked on top of one another, wherein the first semiconductor films and fourth semiconductor films contain a first semiconductor material, the second semiconductor films and third semiconductor films contain a second semiconductor material, and the first and second semiconductor films each have a first sidewall in contact with a dielectric structure and the third and fourth semiconductor films each have a first sidewall in contact with the dielectric structure;
removing the second semiconductor films;
forming a first gate structure around at least a top surface, a bottom surface, and a second sidewall of each of the first semiconductor films opposite to its respective first sidewall;
removing the fourth semiconductor films; and
forming a second gate structure around at least a top surface, a bottom surface, and a second sidewall of each of the third semiconductor films opposite to its respective first sidewall,
wherein each of the first semiconductor films is laterally aligned with a corresponding one of the third semiconductor films, and each of the second semiconductor films is laterally aligned with a corresponding one of the fourth semiconductor films.

2. The method of claim 1, further comprising:
forming, over a first portion of a substrate, a first semiconductor layer containing the first semiconductor material;
forming, over the first portion of the substrate and further over a second portion of the substrate, a second semiconductor layer containing the second semiconductor material;
forming, over the first and second portions of the substrate, a third semiconductor layer containing the first semiconductor material;
forming, over the first and second portions of the substrate, a fourth semiconductor layer containing the second semiconductor material; and
forming, over the first and second portions of the substrate, a fifth semiconductor layer containing the first semiconductor material.

3. The method of claim 2, further comprising:
patterning the first to fifth semiconductor layers to form a first stack and a second stack disposed in the first portion and in the second portion, respectively;
wherein the first stack includes the alternately stacked third semiconductor films and fourth semiconductor films, and the second stack includes the alternately stacked first semiconductor films and second semiconductor films.

4. The method of claim 3, wherein the second stack further includes a fifth semiconductor film disposed on a topmost one of the first semiconductor films, and wherein the semiconductor film contains a third semiconductor material similar to the second semiconductor material.

5. The method of claim 1, wherein the first gate structure includes a first gate electrode and the second gate structure includes a second gate electrode, and wherein the first gate electrode and second gate electrode have opposite conductive types.

6. The method of claim 1, wherein the first semiconductor material comprises silicon germanium, and the second semiconductor material comprises silicon.

7. The method of claim 1, wherein the first semiconductor material is configured for a first transistor with a first conductive type, and the second semiconductor material is configured for a second transistor with a second conductive type.

8. The method of claim 1, further comprising:
forming a pair of first source/drain regions in contact with opposite third and fourth sidewalls of each of the first semiconductor films; and
forming a pair of second source/drain regions in contact with opposite third and fourth sidewalls of each of the third semiconductor films.

9. The method of claim 1, further comprising:
prior to forming the pair of first source/drain regions, replacing at least end portions of the first gate structure that are interposed between neighboring ones of the first semiconductor films with a plurality of first dielectric spacers, respectively; and
prior to forming the pair of second source/drain regions, replacing at least end portions of the second gate structure that are interposed between neighboring ones of the third semiconductor films with a plurality of second dielectric spacers, respectively.

10. A method, comprising:
forming, over a first portion of a substrate, a first stack comprising a plurality of first semiconductor films and a plurality of second semiconductor films alternately stacked on top of one another;
concurrently with forming the first stack, forming, over a second portion of the substrate, a second stack comprising a plurality of third semiconductor films and a plurality of fourth semiconductor films alternately stacked on top of one another, wherein the first semiconductor films and fourth semiconductor films contain a first semiconductor material, and the second semiconductor films and third semiconductor films contain a second semiconductor material;
forming a dielectric structure interposed between the first stack and the second stack;
removing the second semiconductor films;
forming a first gate structure around at least a top surface, a bottom surface, and a first sidewall of each of the first semiconductor films opposite to its respective first sidewall in contact with the dielectric structure;
removing the fourth semiconductor films; and
forming a second gate structure around at least a top surface, a bottom surface, and a second sidewall of each of the third semiconductor films opposite to its respective first sidewall in contact with the dielectric structure,
wherein each of the first semiconductor films is laterally aligned with a corresponding one of the third semiconductor films, and each of the second semiconductor films is laterally aligned with a corresponding one of the fourth semiconductor films.

11. The method of claim 10, wherein the first gate structure includes a first gate electrode and the second gate structure includes a second gate electrode, and wherein the first gate electrode and second gate electrode have opposite conductive types.

12. The method of claim 10, wherein the first semiconductor material comprises silicon germanium, and the second semiconductor material comprises silicon.

13. The method of claim 10, wherein the first semiconductor material is configured for a first transistor with a first conductive type, and the second semiconductor material is configured for a second transistor with a second conductive type.

14. The method of claim 10, further comprising:
forming a pair of first source/drain regions in contact with opposite third and fourth sidewalls of each of the first semiconductor films; and
forming a pair of second source/drain regions in contact with opposite third and fourth sidewalls of each of the third semiconductor films.

15. The method of claim 14, further comprising:
prior to forming the pair of first source/drain regions, replacing at least end portions of the first gate structure that are interposed between neighboring ones of the first semiconductor films with a plurality of first dielectric spacers, respectively; and
prior to forming the pair of second source/drain regions, replacing at least end portions of the second gate structure that are interposed between neighboring ones of the third semiconductor films with a plurality of second dielectric spacers, respectively.

* * * * *